US011903329B2

(12) United States Patent
Burkett

(10) Patent No.: US 11,903,329 B2
(45) Date of Patent: Feb. 13, 2024

(54) REDUCING JUNCTION RESISTANCE VARIATION IN TWO-STEP DEPOSITION PROCESSES

(71) Applicant: Google LLC, Mountain View, CA (US)

(72) Inventor: Brian James Burkett, Santa Barbara, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 17/836,893

(22) Filed: Jun. 9, 2022

(65) Prior Publication Data

US 2022/0328749 A1    Oct. 13, 2022

Related U.S. Application Data

(63) Continuation of application No. 16/648,101, filed as application No. PCT/US2017/052049 on Sep. 18, 2017, now Pat. No. 11,588,094.

(51) Int. Cl.
*H10N 60/01*     (2023.01)
*G06N 10/00*     (2022.01)
*B82Y 10/00*     (2011.01)

(52) U.S. Cl.
CPC .......... *H10N 60/0912* (2023.02); *B82Y 10/00* (2013.01); *G06N 10/00* (2019.01)

(58) Field of Classification Search
CPC ........... H10N 60/0912; H01L 39/2493; B82Y 10/00; G06N 10/00
USPC ....................................................... 438/167
See application file for complete search history.

(56) References Cited

U.S. PATENT DOCUMENTS

| 4,218,532 A | 8/1980 | Dunkleberger |
| 4,533,624 A | 8/1985 | Sheppard |
| 6,103,619 A * | 8/2000 | Lai .................... H01L 21/76829 438/738 |
| 10,121,754 B2 | 11/2018 | Oliver et al. |
| 10,153,240 B2 | 12/2018 | Lu et al. |

(Continued)

FOREIGN PATENT DOCUMENTS

| CN | 1449510 | 10/2003 |
| CN | 103258719 | 8/2013 |

(Continued)

OTHER PUBLICATIONS

CA Office Action in Canadian Appln. No. 3,076,743, dated May 13, 2021, 6 pages.

(Continued)

*Primary Examiner* — Tu-Tu V Ho
(74) *Attorney, Agent, or Firm* — Fish & Richardson P.C.

(57) ABSTRACT

A method of reducing junction resistance variation for junctions in quantum information processing devices fabricated using two-step deposition processes. In one aspect, a method includes providing a dielectric substrate, forming a first resist layer on the dielectric substrate, forming a second resist layer on the first resist layer, and forming a third resist layer on the second resist layer. The first resist layer includes a first opening extending through a thickness of the first resist layer, the second resist layer includes a second opening aligned over the first opening and extending through a thickness of the second resist layer, and the third resist layer includes a third opening aligned over the second opening and extending through a thickness of the third resist layer.

21 Claims, 13 Drawing Sheets

(56) References Cited

U.S. PATENT DOCUMENTS

| 2003/0049951 A1 | 3/2003 | Eldridge et al. |
| 2004/0029050 A1 | 2/2004 | Brenner et al. |
| 2005/0277064 A1 | 12/2005 | Lamarre |

FOREIGN PATENT DOCUMENTS

| CN | 105190870 | 12/2015 |
| JP | S61115360 | 6/1986 |
| WO | WO 87/04857 | 8/1987 |
| WO | WO 02/19036 | 3/2002 |

OTHER PUBLICATIONS

EP Extended Search Report in European Appln. No. 20211972.3, dated Feb. 23, 2021, 6 pages.
JP Decision to Grant a Patent in Japanese Appln. No. 2020-515872, dated Feb. 8, 2021, 5 pages (with English translation).
Ke Zhang et al., "Bridge-free fabrication process for Al/AlOx/Al Josephson junctions," Chin. Phys. B, Jun. 2017, 26(7):078501.
PCT International Preliminary Report on Patentability in International Appln. No. PCT/US2017/052049, dated Jan. 21, 2020, 15 pages.
PCT International Search Report and Written Opinion in International Appln. No. PCT/US2017/052049, dated Jun. 7, 2018, 19 pages.
PCT Written Opinion in International Appln. No. PCT/US2017/052049, dated Aug. 7, 2019, 9 pages.
Wolff et al., "Incident angle dependent damage of PMMA during Ar+-ion beam etching," Microelectronic Engineering, Nov. 2009, 1444-1446.
Office Action in Canadian Appln. No. 3,076,743, dated Feb. 1, 2023, 3 pages.
Office Action in Chinese Appln. No. 201780096732.7, dated Mar. 22, 2023, (with English translation).
Office Action in European Appln. No. 20211972.3, dated Mar. 30, 2023, 4 pages.

\* cited by examiner

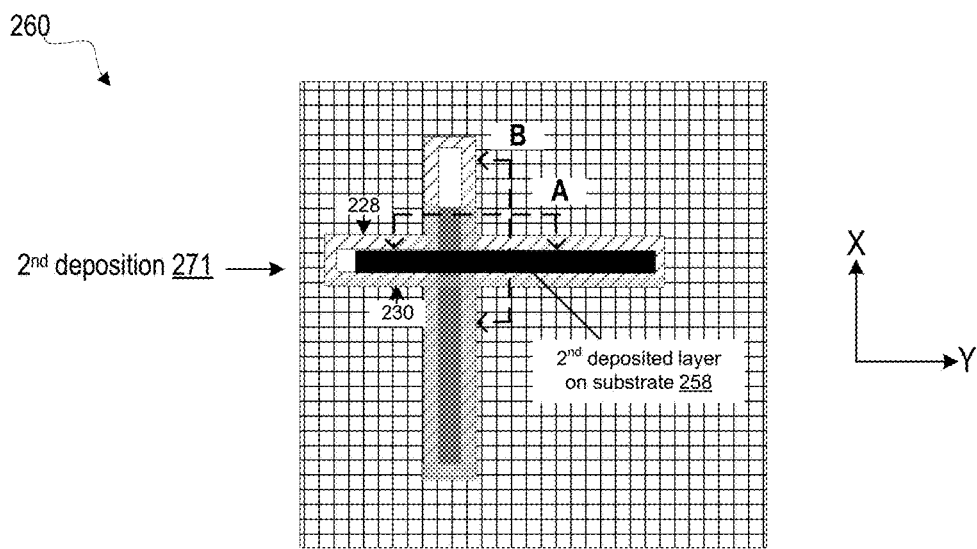
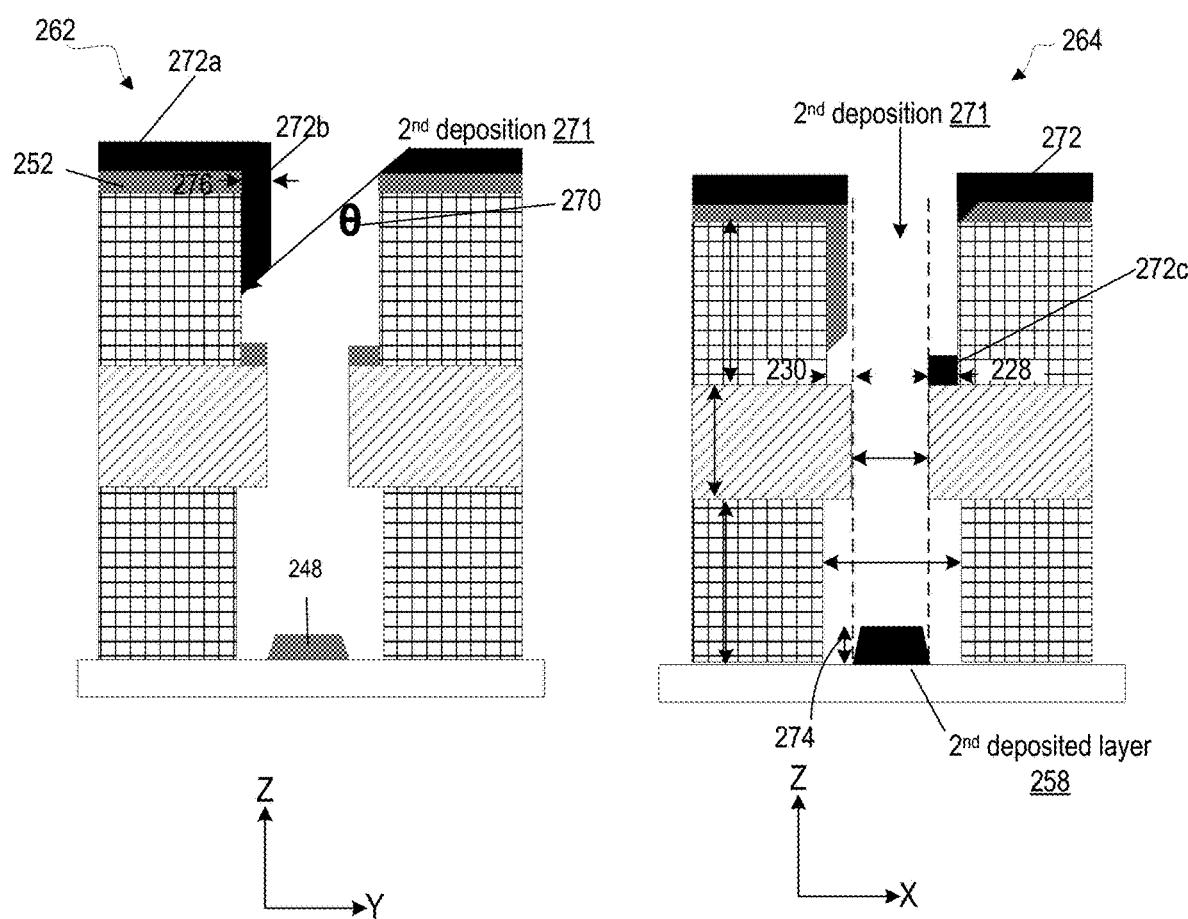
FIG. 2C

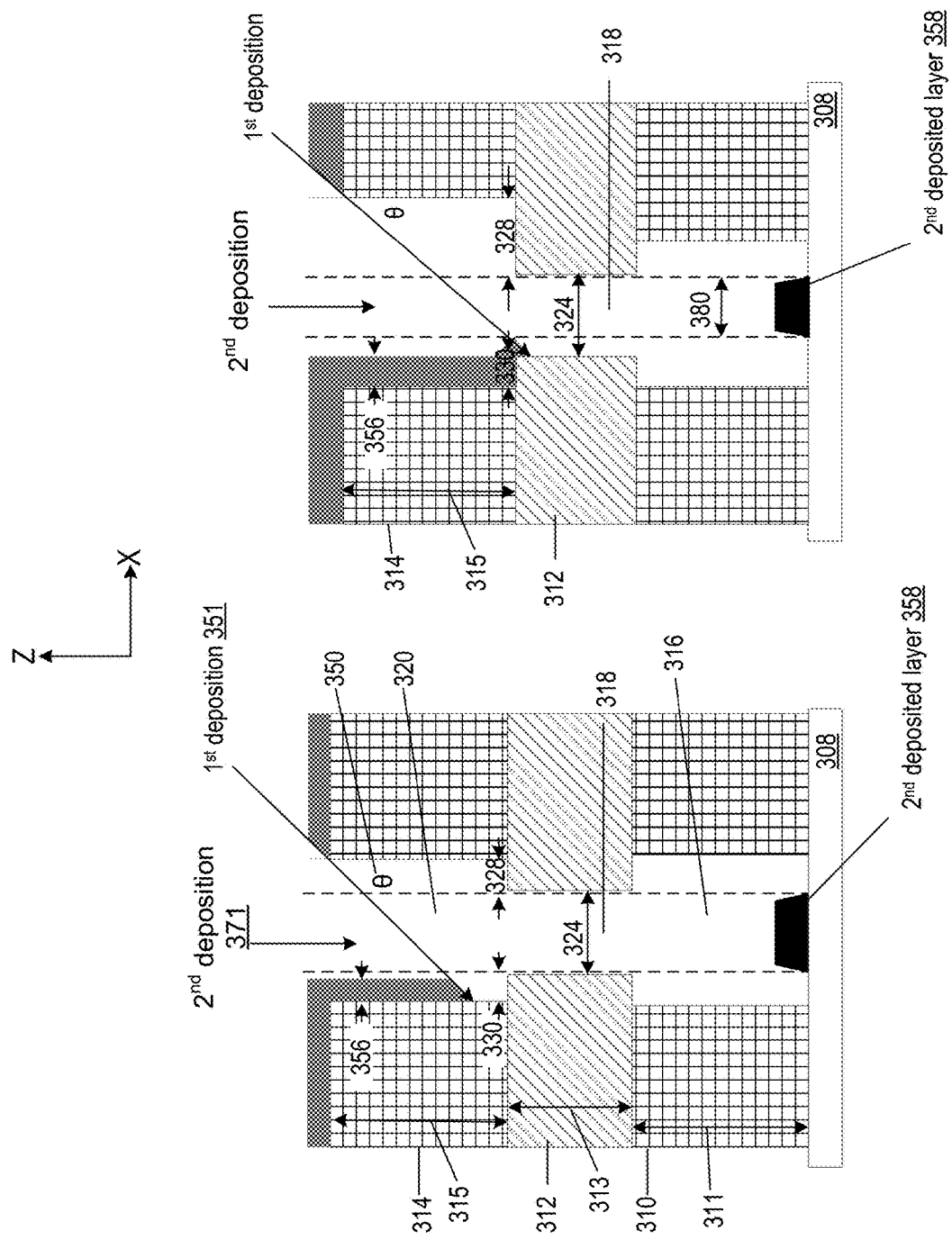

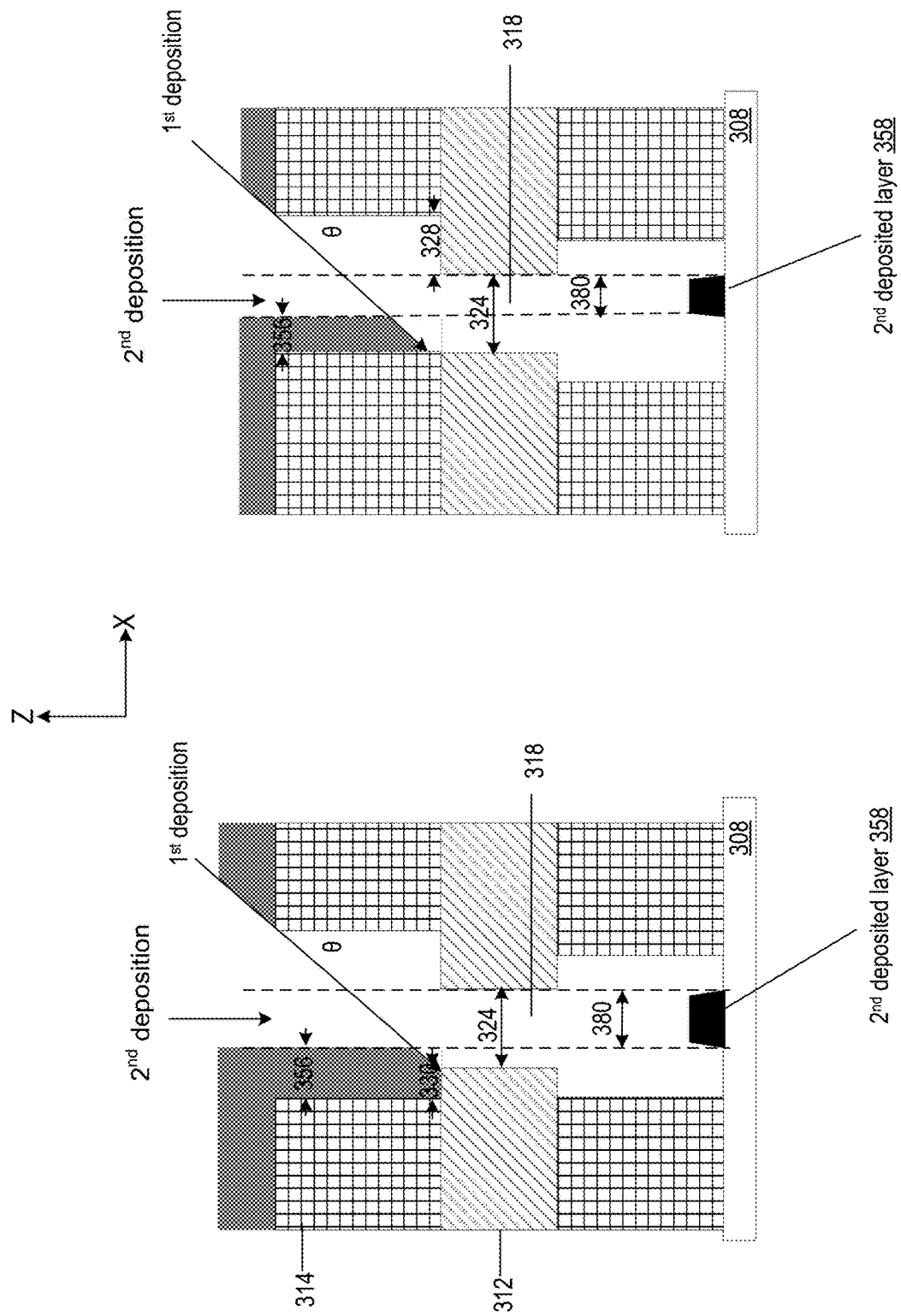

REDUCING JUNCTION RESISTANCE VARIATION IN TWO-STEP DEPOSITION PROCESSES

CROSS REFERENCE TO RELATED APPLICATIONS

This application is a continuation of U.S. patent application Ser. No. 16/648,101, filed on Mar. 17, 2020, which is a national stage application and claims the benefit of International Application No. PCT/US2017/052049, filed Sep. 18, 2017. The disclosures of the prior applications are considered part of and are incorporated by reference in their entirety in the disclosure of this application.

TECHNICAL FIELD

The present disclosure relates to reducing junction resistance variation in two-step deposition processes.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum information processing devices can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, one innovative aspect of the subject matter described in this specification can be embodied in methods that include the actions of providing a dielectric substrate, forming a first resist layer on the dielectric substrate, forming a second resist layer on the first resist layer, and forming a third resist layer on the second resist layer. The first resist layer includes a first opening extending through a thickness of the first resist layer, the second resist layer includes a second opening aligned over the first opening and extending through a thickness of the second resist layer, and the third resist layer includes a third opening aligned over the second opening and extending through a thickness of the third resist layer.

Implementations of these methods can optionally include one or more of the following features. In some implementations, the thickness of each of the first opening, the second opening, and the third opening extend along a first direction normal to a surface of the dielectric substrate, where each of the first opening, the second opening, and the third opening has a corresponding width that extends along a second direction that is orthogonal to the first direction, and where the width of the second opening is less than the width of the first opening and less than the width of the third opening.

In some implementations, the first opening in the first resist layer and the third opening in the third resist layer are defined by exposing the first resist layer, the second resist layer, and the third resist layer in a first pattern, and the second opening in the second resist layer is defined by exposing the first resist layer, the second resist layer, and the third resist layer in a second pattern. The first resist layer, the second resist layer, and the third resist layer are then subsequently developed.

In some implementations, a first layer of material is deposited through the first opening, the second opening, and the third opening at a first deposition angle with respect to the substrate, and a second layer of material is deposited through the first opening, the second opening, and the third opening at a second deposition angle with respect to the substrate. The first layer of material and the second layer of material can be a superconducting material.

In some implementations, a surface oxidation of the first layer of material is performed to provide an oxidized region of the first layer of material prior to depositing the second layer of material. In some implementations, a portion of the first layer of material, a portion of the oxidized region, and a portion of the second layer of material form part of a quantum information processing device, for example, a Josephson junction, where the quantum information processing device can be a qubit.

In some implementations, the first resist layer, the second resist layer, the third resist layer, and excess deposited material are removed, for example, using an etching process.

In some implementations, the dielectric substrate and a material deposition source are arranged according to a first orientation with respect to one another during deposition of the first layer of material, and the dielectric substrate and the material deposition source are arranged according to a second orientation with respect to one another during deposition of the second layer of material, where the first orientation is different from the second orientation. The substrate can be rotated after depositing the first layer of material and prior to depositing the second layer of material. Alternatively, a position of the material deposition source can be changed with respect to the dielectric substrate after depositing the first layer of material and prior to depositing the second layer of material.

In some implementations, the first opening, the second opening, and the third opening define a mask opening region that exposes a surface of the dielectric substrate. A first undercut width can be defined by a distance between a first edge of the second opening and a first edge of the third opening of a first side of the mask opening region. A second undercut width can be defined by a distance between a second edge of the second opening and a second edge of the third opening of a second side of the mask opening region that is directly opposite to the first side of the mask opening region. The first undercut width may be approximately zero.

In some implementations, the second undercut width is greater than a thickness of material deposited on a sidewall of the third resist layer during the first deposition process.

In some implementations, the first side of the mask opening region is closer to a material deposition source than the second side of the mask opening region during the depositing of the first layer of material.

Particular embodiments of the subject matter described in this specification can be implemented so as to realize one or more of the following advantages. For example, in some implementations, the techniques disclosed herein may be used to reduce junction variation and/or improve uniformity of performance between nearest neighbor Josephson junctions on a substrate. In some implementations, the presently disclosed techniques improve overall uniformity of performance of quantum information processing devices by reducing variations in the size of opening regions within a mask layer that can result from deposition parameters (e.g., angle of deposition) and/or incidental deposition on sidewalls of the mask layer. Additionally, overall uniformity of performance of quantum information processing devices can be improved by reducing variations in the size of opening regions (e.g., waviness of the opening region due to deposition roughness) within a mask layer that can result from effects of grain growth and grain morphology in the deposited layers (e.g., aluminum grain growth). By reducing variations in the size of openings within the mask layer, the form and shape of quantum information processing devices, such as Josephson junctions and qubits, fabricated using the mask layer can be made more uniform. In turn, the resulting quantum information processing devices exhibit more uniform operating characteristics, which facilitates the use and design of a global microwave drive method for driving/operating a set of two or more qubits using a single controller. In some implementations, reducing grain growth effects in the deposited layers improves yield of quantum information processing devices (e.g., Josephson junctions and qubits) by reducing a number of junctions broken by grain growth and grain morphology (e.g., grain boundaries) of the deposited layer.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 2A-C are diagrams of various views showing an exemplary two-step deposition process through a three-layer resist mask.

FIGS. 3A-D are diagrams of cross-sectional views of a two-step deposition process for various exemplary three-layer resist masks.

DETAILED DESCRIPTION

The subject matter of the present disclosure relates to techniques for reducing junction resistance across junctions. In a particular implementation, the present disclosure relates to achieving uniform Josephson junction resistances across a substrate.

Quantum computing entails coherently processing quantum information stored in the quantum bits (qubits) of a quantum computer. Superconducting quantum computing is a promising implementation of quantum computing technology in which quantum information processing devices are formed, in part, from superconducting materials. Superconducting quantum computers are typically multilevel systems, in which only the first two levels are used as the computational basis. In certain implementations, quantum information processing devices, such as qubits, are operated at very low temperatures so that superconductivity can be achieved and so that thermal fluctuations do not cause transitions between energy levels. Additionally, it may be preferable that the quantum information processing devices are operated with low energy loss and dissipation (e.g., the quantum circuit elements exhibit a high quality factor, Q). Low energy loss and dissipation may help to avoid, e.g., quantum decoherence.

Fabrication of integrated quantum information processing devices with superconducting components typically involves depositing and patterning superconducting materials, dielectrics and metal layers. Certain quantum information processing devices, such as qubits, are constructed using Josephson junctions. A Josephson junction may be made by sandwiching a thin layer of a non-superconducting material between two layers of superconducting material.

Figure 1A:
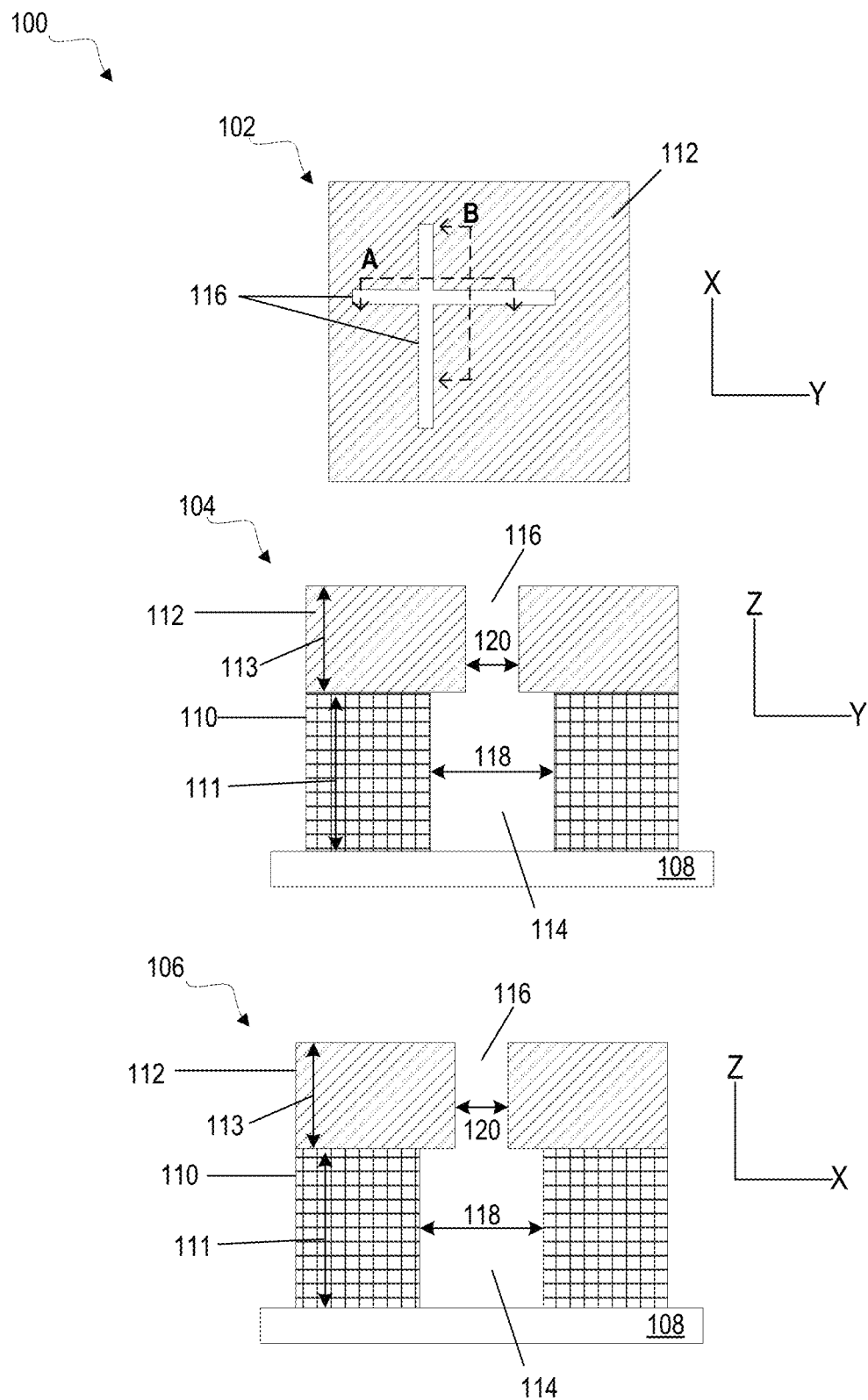
FIGS. 1A-C are diagrams of various views showing an exemplary two-step deposition process through a two-layer resist mask.
Figure 1B:
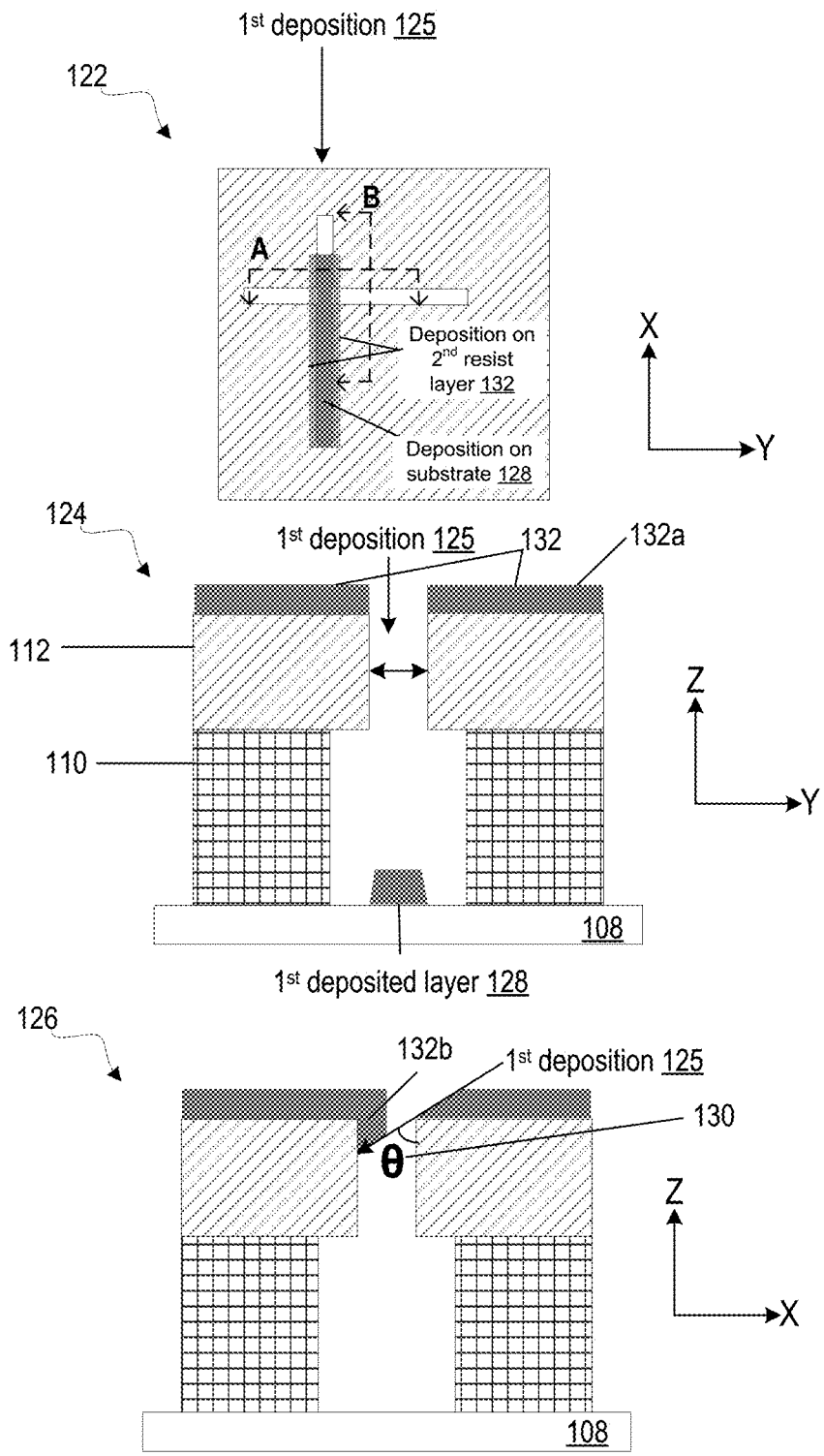
Figure 1C:
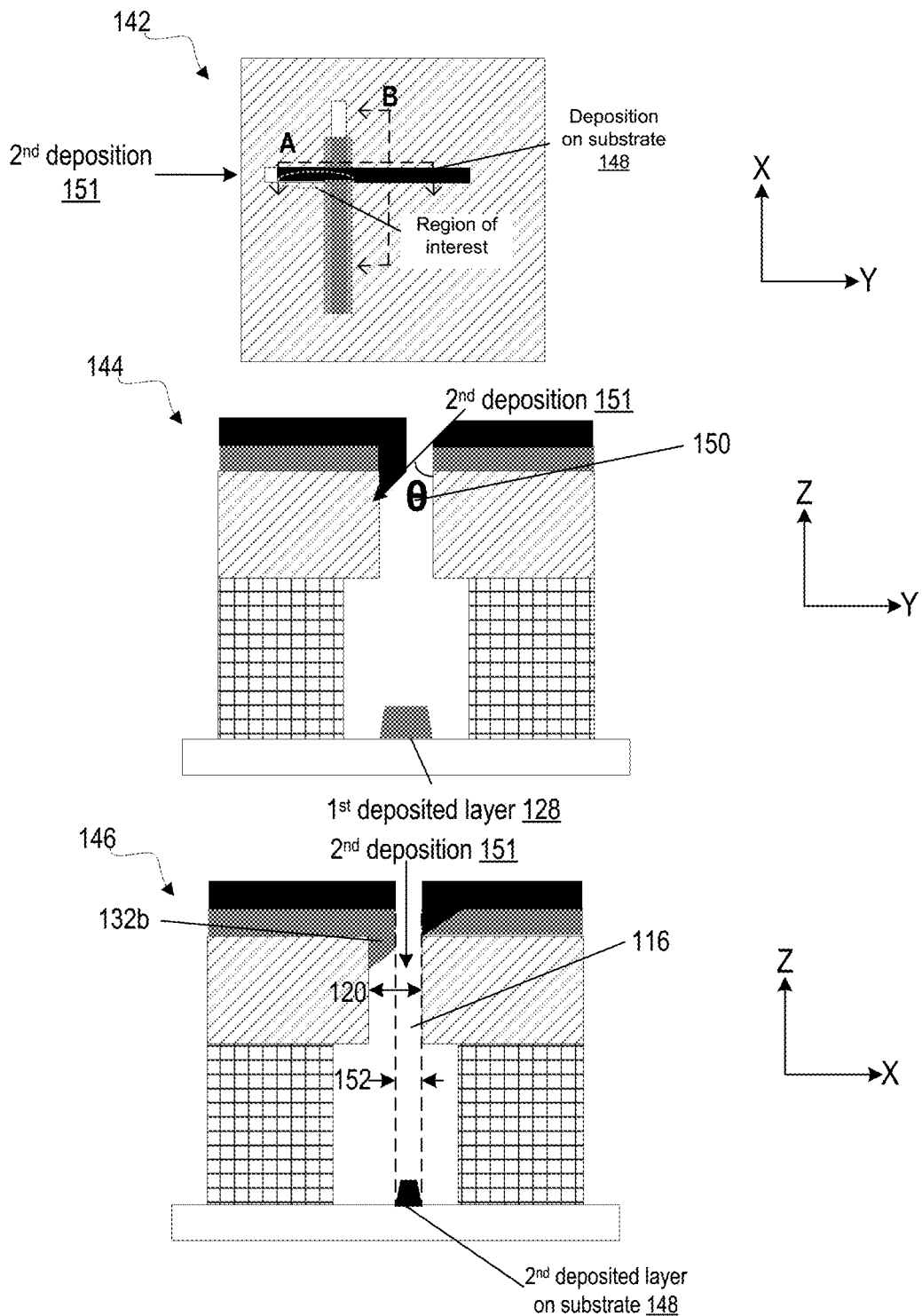

An exemplary process for fabricating a Josephson junction using a two-layer resist mask is described as follows with reference to FIGS. 1A-C. FIGS. 1A-C are diagrams of various views showing an exemplary two-step deposition process through a two-layer resist mask 100. FIG. 1A shows a schematic of a two-layer resist mask 100 in plan-view 102, cross-sectional view 104 through axis A-A, and cross-sectional view 106 through axis B-B. The two-layer resist mask 100 is deposited on a substrate 108 and includes two layers of resist 110 and 112, where a first resist layer 110 has a first thickness 111 and a second resist layer 112 has a second thickness 113, in which the thicknesses are defined in a direction perpendicular to a surface of the substrate 108 on which the resist layers are formed. The two resist layers 110 and 112 can be of different materials, for example, poly(methyl methacrylate) (PMMA), poly(methyl methacrylate-co-methacrylic acid) (P(MMA-MAA)), ZEP520, UV5/UVIII, or similar resist compositions. In an example, the first resist layer 110 is P(MMA-MAA) and the second resist layer 112 is PMMA. First thickness 111 of the first resist layer 110 and the second thickness 113 of the second resist layer 112 can be of a same or different thickness. For example, the first thickness 111 and the second thickness 113 can be in a range of 100-1000 nm thick.

The first resist layer 110 is deposited on a substrate 108 and includes, for example, a layer of P(MMA-MAA). The second resist layer 112 is deposited on top of the first resist layer 110 and includes, for example, a layer of PMMA. In some implementations, the first resist layer 110 and the second resist layer 112 are baked to remove solvents from the deposited layers.

The first resist layer 110 and the second resist layer 112 are patterned to define openings within the resist (e.g., opening 114 and opening 116). The first opening 114 within the first resist layer 110 may be defined by selectively exposing the first resist layer 110 and the second resist layer 112 to a source (e.g., light or an electron beam, not shown) at a first dosage range between 0-1000 $\mu C/cm^2$ such that the exposed portions of the first resist layer 110 become either soluble or insoluble when treated with a developer solution, but that the exposed portions of the second resist layer 112 do not become either soluble or insoluble. In one example, the first dose is 350 $\mu g/cm^2$ to expose the first resist layer of P(MMA-MAA). The first opening 114 within the first resist layer 110 can be defined through a thickness of the first resist layer from a top surface of the first resist layer 110 to the substrate 108 along a direction normal to a surface of the substrate 108 (e.g., along a z-axis), and includes a width 118 that extends along a direction orthogonal to the thickness of the first resist layer (e.g., along an x-axis and/or y-axis).

The second opening 116 within the second resist layer 112 may be defined by exposing the first resist layer 110 and the second resist layer 112 to a source (e.g., light or an electron beam, not show) at a second dosage range between 1000-2000 µC/cm² that is sufficiently high such that the exposed portions of the second resist layer 112 become either soluble or insoluble when treated with developer solution. In one example, the second dosage is 1500 µg/cm² to expose the second resist layer 112 of PMMA. The second opening 116 within the second resist layer 112 can be defined through a thickness of the second resist layer from a top surface of the second resist layer 112 to the top surface of the first resist layer 110 along a direction normal to the surface of the substrate 108 (e.g., along the z-axis), and includes a width 120 that extends along a direction orthogonal to the thickness of the second resist layer (e.g., along an x-axis and/or y-axis).

Subsequent to the deposition and exposure of each resist layer, the first resist layer 110 and the second resist layer 112 are then developed to selectively remove either the exposed or non-exposed regions of the respective resist layers, depending on the type of resist used (e.g., positive or negative resist). Developing the first resist layer and the second resist layer removes the resist material from within the respective openings defined in the first resist layer and the second resist layer. In some implementations, one or more development processes are used depending, in part, on the composition of the respective resist layers. For example, a development process can include methyl isobutyl ketone isopropyl alcohol (MIBK:IPA) in a 1:3 ratio.

In some implementations, at least a portion of the second opening 116 defined in the second resist layer 112 is aligned over at least a portion of the first opening 114 defined in the first resist layer 110 such that a portion of the substrate 108 is exposed.

In some implementations, a width 120 of the second opening 116 is smaller than a width 118 of the first opening 114. For example, in some implementations, the width 120 is 200 nm and the width 118 is 400 nm. Width 120 of the second opening 116 in the second resist layer 112 can define a feature size (e.g., a width) of one or more deposited structures (e.g., a top contact or bottom contact, such as a top or bottom contact of a Josephson junction).

After selectively removing the resist in predefined areas, material that will form a part of a quantum information processing device (e.g., a qubit including a Joseph junction) may be deposited within the opened areas and on the remaining resist. In some implementations, an angled shadow evaporation technique may be used to deposit material that will form portions of a quantum information processing device (e.g., a qubit including a Josephson junction). For example, the substrate having the patterned resist may be placed within a deposition chamber (e.g., a chamber of a physical vapor deposition system) and subjected to a first layer deposition process where the flux of material to be deposited is introduced at a non-normal angle with respect to the substrate, such that a portion of the patterned resist layer may block or "shadow" at least some of the deposited material, and then subjected to a second layer deposition process where the orientation of the substrate relative to the material deposition source is changed.

FIG. 1B shows a schematic of the two-layer resist mask 100 in plan-view 122, cross-sectional view 124 through axis A-A, and cross-sectional view 126 through axis B-B after a first deposition of material from a first deposition flow direction 125 to form a portion of a Josephson junction. The first deposition from first deposition flow direction 125 of a material forms a first deposited structure (e.g., a bottom contact 128 for a Josephson junction) on the substrate 108 and within the opened region (e.g., an aligned portion of the first opening 114 and the second opening 116) of the resist mask. The first deposition flow direction 125 of the deposition material (e.g., a flux of material from a source) contains a component along an x-axis parallel to a surface of the substrate 108 and is oriented at an angle 130 with respect to a z-axis that is normal to the substrate 108, such that a portion of the second resist layer 112 near the edge of the second opening 116 blocks at least some of the deposition material of the first deposition flow direction 125 within the opened regions. The first deposition flow direction 125 can be oriented, for example, at an angle 130 between 10-80° degrees with respect to the z-axis. In some implementations, the first deposition of material results in deposited layers 132 on the second resist layer 112. The deposited layers 132 can include a top surface region 132a on a top surface of the second resist layer 112 and a side wall region 132b on a side wall of the second resist layer 112.

After the first layer deposition step, the substrate 108 may be transferred to air or to a separate chamber where surface oxidation of the deposited material is promoted. In some implementations, the substrate may be left in the deposition chamber for in-situ oxidation. After oxidation, the substrate then may be subjected to a second layer deposition step, in which a second deposition material is deposited to form a second deposited structure (e.g., a top contact 148 for a Josephson junction).

In some implementations, an orientation of the substrate 108 with respect to the deposition material source is changed. For example, the deposition material source can be rotated with respect to the substrate 108 or the substrate 108 can be rotated with respect to the material deposition source, depending in part on a configuration of the deposition system.

FIG. 1C shows a schematic of the two-layer resist mask 100 in plan-view 142, a cross-sectional view 144 through axis A-A, and a cross-sectional view 146 through axis B-B after a second deposition of material to form a Josephson junction. A second deposition flow direction 151 of the deposition material contains a component along a y-axis parallel to the surface of the substrate 108 and is oriented at an angle 150 with respect the z-axis, such that a portion of the second resist layer and/or the previously deposited first layer of material from the first deposition process near the edge of opened areas blocks at least some of the deposition material from the second deposition flow direction 151 within the opened regions. The second deposition flow direction 151 can be oriented, for example, at an angle 150 between 10-80° degrees with respect to the z-axis. The angle 150 of orientation during the second deposition may be different from the angle 130 of orientation during the first deposition. For example, in some implementations, the substrate surface may be oriented at angle 130 with respect to the first deposition flow direction 125 of the deposition material during the first deposition step and at angle 150 with respect to the second deposition flow direction 151 that is orthogonal to the first angle 130 during the first deposition step.

After the shadow evaporation process, the resist may be removed in a lift-off step to remove unwanted material and complete the fabrication of the quantum information processing device (e.g., a qubit including a Josephson junction).

Lift-off may be performed using various different solvents and/or chemistries depending on the chemical composition of the resist material.

In some cases, the deposition process, such as the shadow evaporation process described with reference to FIGS. 1A-C, deposits material in a non-uniform manner and results in non-uniform performance of the quantum information processing device (e.g., a qubit including a Josephson junction). For example, side wall deposition 132b from a first deposition step can shadow at least a portion of an opening 116 (as depicted in cross-section view 146) such that at least a portion of a second deposited layer (e.g., a top contact 148) deposited during a second deposition step has a width 152 that is different than an intended width 120 defined by opening 116 in the second resist layer 112.

The change in layer width caused by the shadowing effect of the first deposited layer can lead to non-uniformities in the deposited layers. For example, a junction resistance of a Josephson junction is inversely proportional to the cross-sectional area of where a first superconducting layer of the junction crosses a second superconducting layer of the junction. Non-uniformity in the deposition of the second superconducting layer width (e.g., a width 152 being different than an intended width 120) can result in a variation of the junction resistance by altering the cross-sectional area of overlap between the first superconducting layer and the second superconducting layer of the junction. Additionally, the resistances can be non-uniform across different devices in different locations on the substrate 108 due to variation in the shadowing effects (e.g., a variation in the angles of deposition 130, 150). In turn, the non-uniform junction resistance can cause quantum information processing devices that include the junctions, such as superconducting qubits, to exhibit non-uniform operating frequencies.

The techniques disclosed herein can be used to reduce shadowing effects resulting from material deposited on resist sidewalls. Shadowing effects occur when the resist mask and/or incidental deposition on the resist mask unintentionally block or affect at least a portion of incident flux of material from depositing through an opening in the resist mask. Shadowing effects can cause the resulting structures deposited through the opening of the resist mask to have final dimensions different from one or more intended dimensions, and can also cause roughening of the resulting structures deposited through the opening of the resist mask. Shadowing effects may result from incidental deposition of material on one or more surfaces of the mask, in which the material alters or obstruct a portion of an opening of the resist mask. By reducing the shadowing effects, it is possible, in some implementations, to obtain structures having final dimensions that are closer to intended dimensions. Furthermore, reducing shadowing effects can result in more uniformity in the final dimensions across multiple structures, which in turn may lead to more uniform operating characteristics (e.g., Josephson Junction resistance) across multiple devices.

The techniques disclosed herein include introducing a three-layer resist stack to reduce shadowing effects caused by sidewall deposition. For instance, a multilayer shadow mask is defined on the substrate, including a first resist layer, a second resist layer, and a third resist layer, where each resist layer includes an opening having a respective width. The second resist layer includes an opening width defining a feature dimension desired for the deposited junction. The third resist layer thickness and opening width are selected to prevent deposition on a sidewall of the second resist layer, which would otherwise block material flux from passing through the opening in the second resist layer during the second deposition step.

Figure 2A:
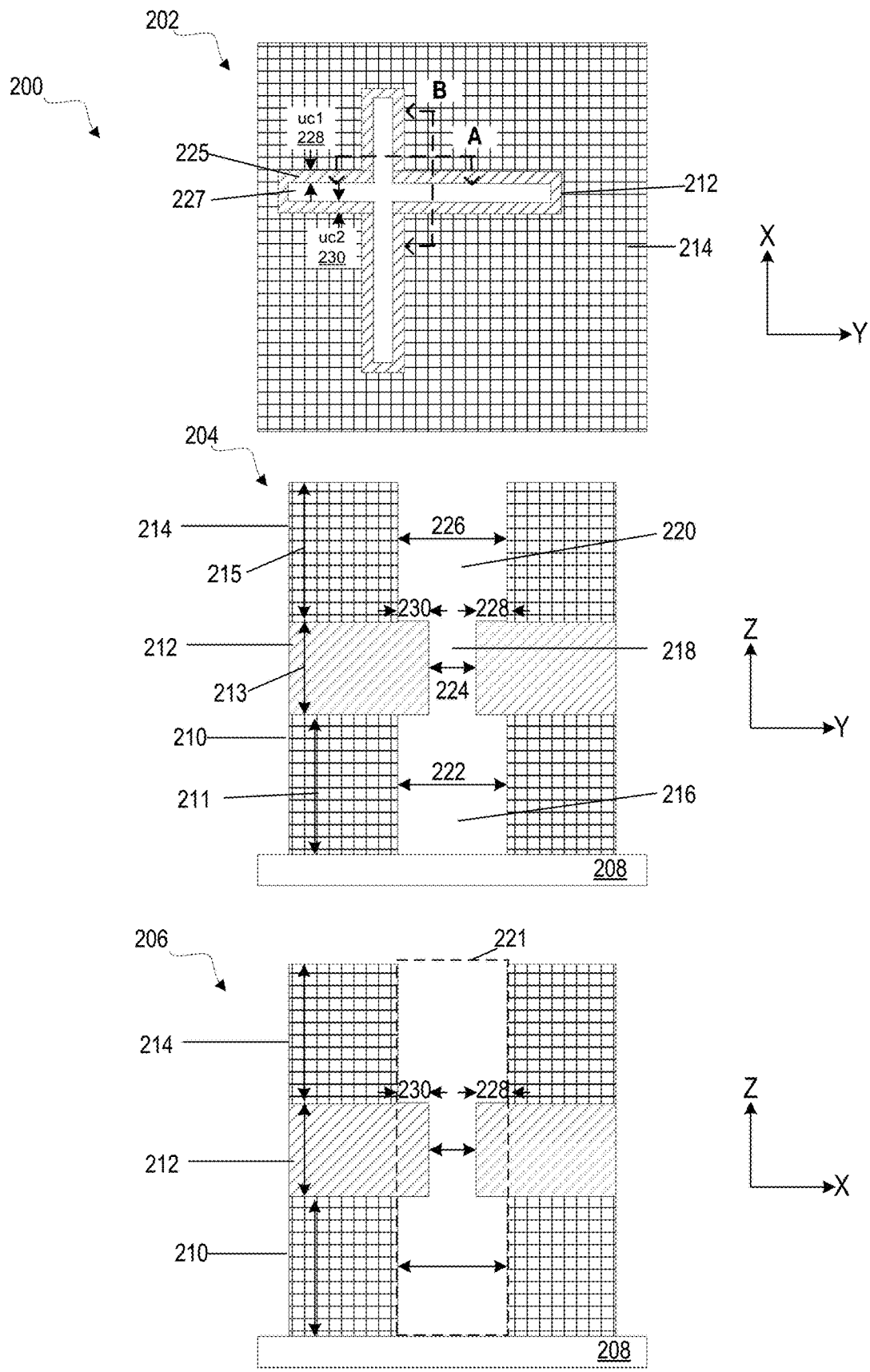
Figure 2B:
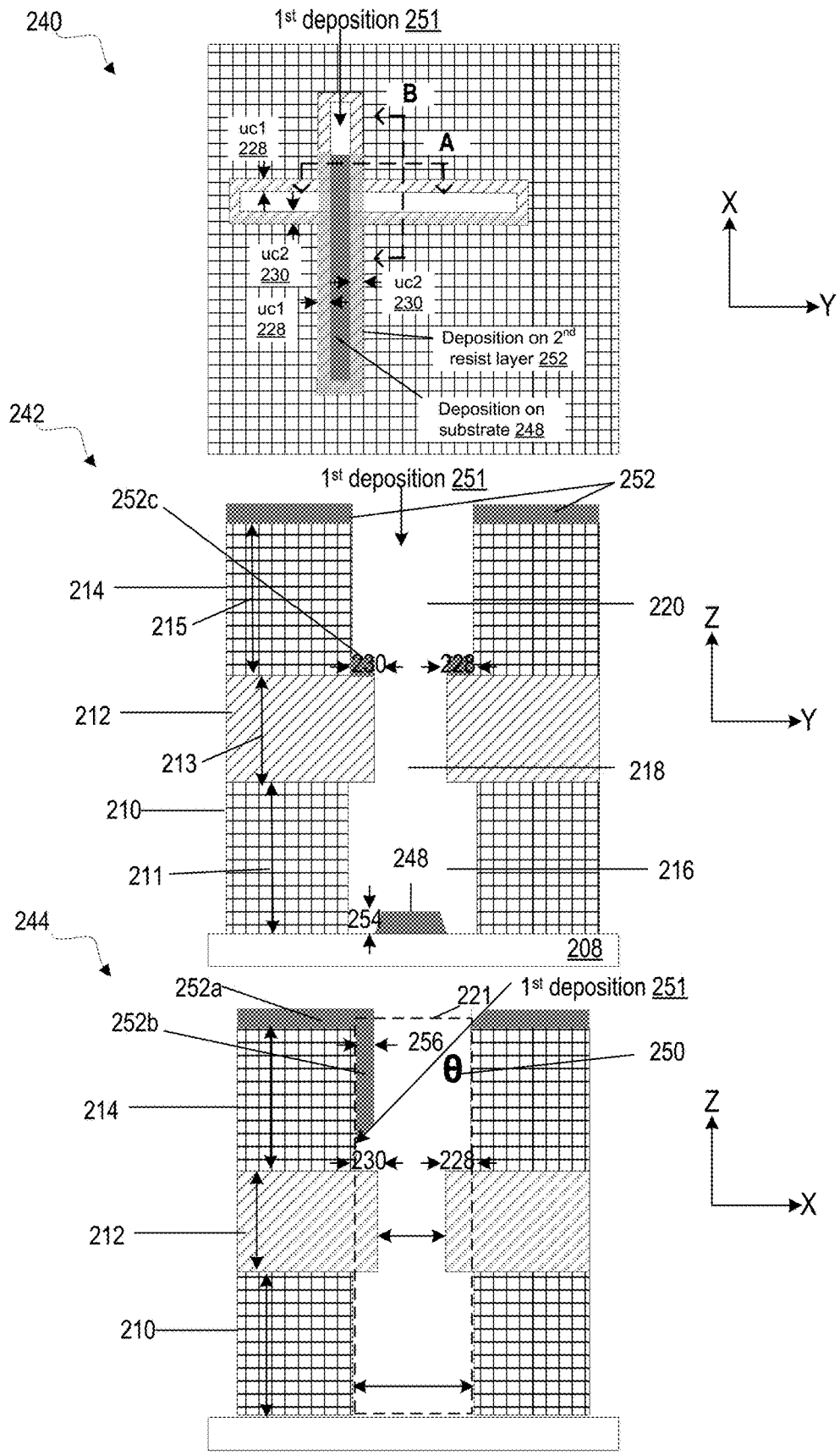

FIGS. 2A-C are diagrams of various views showing an exemplary two-step deposition process through a three-layer resist mask 200. FIG. 2A shows a schematic of a three-layer resist mask 200 in plan-view 202, a cross-sectional view 204 through axis A-A, and a cross-sectional view 206 through axis B-B. The three-layer resist mask 200 is deposited on a substrate 208 and includes three layers of resist: a first resist layer 210 having a first thickness 211, a second resist layer 212 having a second thickness 213, and a third resist layer 214 having a third thickness 215, where resist layer 214 is a top-layer of the three-layer resist mask and is visible in the plan-view illustration 202 of the three-layer resist mask 200.

The first thickness 211 of the first resist layer 210, the second thickness 213 of the second resist layer 212, and the third thickness 215 of the third resist layer 214 can be of a same or different thicknesses, for example a range of 100-1000 nm in a direction perpendicular to the substrate 108. In one example, a first resist layer 210 has a first thickness 211 of 500 nm, a second resist layer 212 has a thickness 213 of 300 nm, and a third resist layer 214 has a third thickness 215 of 500 nm.

The three resist layers 210, 212 and 214 can be poly (methyl methacrylate) (PMMA), poly(methyl methacrylate-co-methacrylic acid) (P(MMA-MAA)), ZEP520, UV5/UVIII, or similar resist compositions. Different resist materials are selected for resist layers in contact with each other to aid in the formation of the openings within the resist layers. For instance, the first resist layer and the second resist layer are of different resist compositions, and the second resist layer and third resist layer are of different resist compositions. In one example, the first resist layer 210 is P(MMA-MAA), the second resist layer 212 is PMMA, and the third resist layer 214 is P(MMA-MAA).

The first resist layer includes a first opening 216, where the first opening 216 extends from a top surface of the first resist layer 210 through the first thickness 211 to the substrate 208 in a direction normal to a surface of the substrate 208 (e.g., along a z-axis). The second resist layer includes a second opening 218, where the second opening 218 extends from a top surface of the second resist layer 212 through the second thickness 213 to a top surface of the first resist layer 210 in a direction normal to a surface of the substrate 208 (e.g., along the z-axis). The third resist layer 214 includes a third opening 220, where the third opening 220 extends from a top surface of the third resist layer 214 through the third thickness 215 to a top surface of the second resist layer 212 in a direction normal to a surface of the substrate 208 (e.g., along the z-axis). Together, the openings 216, 218, and 220 are aligned with respect to one another such that a portion of the substrate 208 is exposed, as depicted, for example, in cross-sectional view 204.

The first opening 216 in the first resist layer 210 includes a width 222, the second opening 218 in the second resist layer 212 includes a width 224, and the third opening 220 in the third resist layer 214 includes a width 226. The width 222, the width 224, and the width 226 can be different values, for example between a range of 10 nm-10 microns. Other widths are also possible. Width 222, width 224, and width 226 extends along a direction orthogonal to a respective thickness of each corresponding resist layer 210, 212, 214 (e.g., along an x-axis and/or y-axis).

In some implementations, one or more dimensions (e.g., a width) of a deposited feature (e.g., a top contact or a bottom contact, such as a bottom or top contact of a Josephson junction) can be defined by the width 224 of the second opening 218, as discussed in further detail below with reference to FIGS. 1B-C.

The resist layers of the multi-layer resist mask 200 can be deposited and patterned as follows. The first resist layer 210 is deposited on the substrate 208 (e.g., spun onto the substrate 208). The second resist layer 212 is deposited (e.g., spun on) on top of the first resist layer 210. The second resist layer 212 is of a different resist material than the first resist layer 210. The third resist layer 214 is deposited (e.g., spun on) on top of the second resist layer 212, where the third resist layer 214 is of a different resist material than the second resist layer 212.

In some implementations, a baking step to bake out the solvents from each resist layer is done after the deposition of each resist layer and prior to the deposition of a subsequent resist layer. A baking step can also include baking all deposited resist layers simultaneously. A baking temperature and time of bake for each resist layer can depend, in part, on the material of the resist layer and a thickness of the resist layer.

In some implementations, the respective resist layers of the multi-layer resist mask 200 are exposed to respective patterns to defining one or more features (e.g., openings 216, 218, and 220) in each respective layer of the multi-layer resist mask using e-beam lithography. The respective patterns to define one or more features (e.g., openings) in each layer can be defined by one or more write files for an e-beam lithography system. Each exposure to define a pattern including one or more features (e.g., openings) can include an exposure dose, where a particular exposure dose depends, in part, on a resist material and a thickness of the resist layer. For example, a range of exposure dosages for P(MMA-MAA) is 0-1000 $\mu C/cm^2$. In another example, a range of exposure dosages for PMMA is 1000-2000 $\mu C/cm^2$.

Exposure doses can be selected to define features in particular resist layers and not in other resist layers of the multi-layer resist mask. For example, resist layers composed of P(MMA-MAA) require a much lower exposure dose to define features than resist layers composed of PMMA, such that a sufficient low exposure dose (e.g., 350 $\mu C/cm^2$) would expose the resist layers composed of P(MMA-MAA) and define one or more features and not expose the resist layers composed of PMMA and define the one or more features.

In one example, a first exposure dose is selected such that the exposure dose is sufficient to define features corresponding to a pattern into the first resist layer 210 and third resist layer 214 (e.g., the P(MMA-MAA) resist layers), but not sufficient to define the features corresponding to the pattern into the second resist layer 212 (e.g., the PMMA resist layer). A second exposure dose is selected such that the exposure dose is sufficient to define features corresponding to another pattern into the first resist layer 210, the second resist layer 212, and the third resist layer 214 (e.g., 1500 $\mu C/cm^2$).

In some implementations the multi-layer resist mask 200 is exposed first at a high dose to define features, for example, in all three resist layers in a single pattern and subsequently at a low dose to define features, for example, in the first resist layer 210 and the third resist layer 214. The multi-layer resist mask 200 can be exposure first at a low dose and subsequently at a high dose.

In some implementations, the first resist layer 210 and the third resist layer 214 have a same width of the respective openings defined in the resist layers (e.g., opening 216 and opening 220), and where the openings are directly aligned on top of each other (with the second resist layer 212 in between).

Subsequent to the deposition and exposure of each resist layer, the first resist layer 210, the second resist layer 212, and the third resist layer 214 are then developed to selectively remove either the exposed or non-exposed regions of the respective resist layers, depending on the type of resist used for each layer (e.g., positive or negative resist). Developing the first resist layer 210, the second resist layer 212, and the third resist layer 214 removes the resist material from within the respective openings defined in each of the first resist layer 210, the second resist layer 212, and the third resist layer 214. In some implementations, one or more development processes are used depending, in part, on the composition of the respective resist layers. In some implementations, a development process is a single step process and includes a developer, for example, methyl isobutyl ketone:isopropyl alcohol (MIBK:IPA) (e.g., 1:3 ratio) for a development time range between 45-90 seconds. In one example, the multi-layer resist mask is developed in MIBK:IPA for 45 seconds in order to achieve 100 nm-1000 nm openings and 100 nm undercut widths.

In some implementations, the first resist layer 210 and the second resist layer 212 are deposited and patterned using e-beam lithography by exposing them to respective first dosages and second dosages, and then a subsequent third resist layer 214 is deposited and patterned by exposing the multi-layer resist mask 200 to a third dosage.

Deep UV lithography (DUV lithography) can be used to expose and pattern one or more openings in the resist layers of the multi-layer resist mask 200 in combination with or instead of e-beam lithography. Resist materials can each be selected for the first resist layer, the second resist layer, and the third resist layer that are compatible with e-beam lithography (e.g., P(MMA-MAA), PMMA), DUV lithography (e.g., UV6), or both e-beam lithography and DUV lithography (e.g., P(MMA-MAA), PMMA). A range of exposure dosages for patterning a resist layer of UV6 using DUV lithography can include 18-28 $mJ/cm^2$. In one example, an exposure dose for patterning a UV6 resist layer is 25 $mJ/cm^2$. Exposure dosages for patterning a resist layer of PMMA using DUV lithography can include dosages >500 $mJ/cm^2$, based in part on a sensitivity of PMMA at a wavelength of the DUV lithography system (e.g., 248 nm).

In one example, the first resist layer 210 and the second resist layer 212 that are compatible with e-beam lithography (e.g., P(MMA-MAA) and PMMA respectively) are deposited, and a third resist layer that is compatible with DUV lithography (e.g., UV6) is deposited on top. DUV lithography can be used to expose the third resist layer 214 using a reticle defining a pattern. Subsequently, e-beam lithography can be used to expose and pattern the first resist layer 210 and the second resist layer 212, in a same manner as described above.

In another example, the first resist layer 210 and the second resist layer 212 can be deposited using materials compatible with e-beam lithography and patterned by exposure using e-beam lithography. Subsequently, a third resist layer 214 compatible with DUV lithography can be deposited on top of the second resist layer 212 and exposed using DUV lithography.

In another example, the first resist layer 210 and the second resist layer 212 can be deposited using material compatible with DUV lithography and patterned by exposure using DUV lithography. In some implementations, the second resist layer 212 is a resist material (e.g., UV6) that is sensitized to ultraviolet light, and the first resist layer 210 is a lift-off layer (LOL). Subsequently, a third resist layer 214 is deposited on top of the second resist layer that is compatible with e-beam lithography processes and is patterned by exposure using e-beam lithography.

In another example, the first resist layer 210, the second resist layer 212, and the third resist layer 214 include resist materials that are compatible with DUV lithography (e.g., UV6, UV210), as well as lift-off layer materials (e.g., LOL, LOR, PMGI). The first resist layer 210 and the second resist layer 212 can be deposited and patterned using one or more reticles in a DUV lithography system, and then the third resist layer can be deposited on top of the second resist layer and patterned by exposure through a reticle in the DUV lithography system. The first resist layer 210, second resist layer 212, and third resist layer 214 can also all be deposited and then patterned in at least one exposure step using DUV lithography.

Once the first resist layer 210, the second resist layer 212, and the third resist layer 214 are deposited and patterned, the multi-resist layer mask 200 is developed using one or more development processes. Development processes can include using a developer such as MIBK:IPA 1:3 to remove the exposed or unexposed resist material (e.g., depending on positive or negative resist). A development process can also include AZ300MIF, 0.26N developers (e.g., 2.38% tetramethylammonium hydroxide), or similar developer to develop, for example, resist layers including UV6 resist material and LOL resist materials. It should be noted that developers used to develop one or more resist layers must be compatible (e.g., not attack or damage) other resist layers. For example, AZ300MIF is used to develop UV6 resist material and does not damage or attack PMMA resist material.

In some implementations, a width 226 of the third opening 220 is wider than a width 224 of the second opening 218, where a portion of the third opening 220 is aligned over the second opening 218. The width 226 of the third opening 220 can range from, e.g., 20 nm-20 µm, and the width 224 of the second opening 218 can range from, e.g., 10 nm-10 µm. For example, the width 226 of the third opening 220 is 400 nm and the width 224 of the second opening 218 is 200 nm. In another example, the width 226 is 500 nm and the width 224 is 300 nm. Other widths also may be used.

In some implementations, the width 226 of the third opening 220 is larger than the width 224 of the second opening 218 and at least a portion of the third opening 220 in the third resist layer 214 of the multi-layer resist mask 200 is aligned over at least a portion of the second opening 218 in the second resist layer 212 such that a portion of a top surface of the second resist layer 212 is exposed. In some implementations, at least a portion of the third opening 220 in the third resist layer 214 is aligned over at least a portion of the second opening 218 in the second resist layer 212 and at least a portion of the first opening 222 in the first resist layer 210 such that a portion of a surface of the substrate 108 is exposed. For example, in the three-layer resist mask 100 as shown in plan-view schematic 202, a portion 225 of a top surface of the second resist layer 212 is exposed and a portion 227 of a surface of the substrate 208 is exposed by the alignment of the first opening 222, the second opening 224, and the third opening 226.

In some implementations, the first opening 216, the second opening 218, and the third opening 220 define a mask opening region 221 that exposes a surface of the substrate 208. A first side of the mask opening region 221 includes a first undercut width 228 defined by a distance between a first edge of the second opening 218 and a first edge of the third opening 220. A second side of the mask opening region 221 which is directly opposite of the first side of the mask opening region 221 includes a second undercut width 230 defined by a distance between a second edge of the second opening 218 and a second edge of the third opening 220.

In some implementations, the first side (including the first undercut width 228) and second side of the mask opening region 221 (including the second undercut width 230) are defined in part based on the respective proximity to a material deposition source, which is described in further detail with reference to FIGS. 2B-C. In some implementations, the openings in the resist layers may be part of a larger design that defines at least a portion of a quantum information processing device (e.g., a qubit including a Josephson junction). For example, as shown in the plan view 202 of FIG. 2A, the openings define the layout of a bottom contact of a Josephson junction and a top contact of a Josephson junction that overlaps the bottom contact.

In some implementations, the third resist layer can have a smaller width of the third opening than the width of the first opening of the first resist layer by exposing the third resist layer to a pattern that is narrower than the pattern exposed on the first resist layer, and can additionally be off-set (e.g., not directly aligned with the first opening but still within the bounds of the first opening), as discussed in more detail with reference to FIG. 4A.

After selectively removing the resist in predefined areas for the three-layer resist mask 200 to provide the first opening 216, the second opening 218 and the third opening 220, a shadow evaporation technique may be used to deposit material that will form portions of a circuit element, e.g., the shadow evaporation may be used to form a Josephson junction that will form part of a quantum information processing device, such as a qubit. In particular, the substrate having the patterned resist is placed within a deposition chamber (e.g., a chamber of a physical vapor deposition system) and is subjected to a first layer deposition process. Deposited material can include, for example, gold, silver, platinum, niobium, molybdenum, tantalum, aluminum, and indium.

FIG. 2B shows a schematic of the three-layer resist mask 200 in plan-view 240, a cross-sectional view 242 through axis A-A, and a cross-sectional view 244 through axis B-B after a first deposition of material from a first deposition flow direction 251 to form a Josephson junction. During the first deposition step, the first deposition flow direction 251 is oriented at an angle 250 with respect a z-axis that is normal to a surface of the substrate 208, such that a portion of the third resist layer 214 near the edge of the third opening 220 blocks at least some of the deposited material of the first deposition from the first deposition flow direction 251 within the opened regions. The first deposition flow direction 251 can be oriented, for example, at an angle 250 between 10-80° degrees with respect to the z-axis.

In some implementations, the first side of the mask opening region 221 including the first undercut width 228 is defined by a difference in a distance between the respective edges of the second opening 218 and the third opening 220 that are closer to a material deposition source. For example, as depicted in plan-view 240 and in cross-sectional view 244 of three-layer resist mask 200 in FIG. 2B for first deposition flow direction 251, first undercut width 228, and second undercut width 230. The second side of the mask opening region 221 including the second undercut width 230 is defined by a difference in a distance between the respective edges of the second opening 218 and the third opening 220 that are further from a material deposition source as depicted, for example, in plan-view 240 and in cross-sectional view 244 of three-layer resist mask 200 in FIG. 1B for the first deposition flow direction 251.

The material deposited from the first deposition produces a first structure (e.g., a bottom contact 248 for a Josephson junction) on the substrate 208 and within the opened regions of the three-layer resist mask 200 (see, for example, cross-sectional view 242 in FIG. 1B). In some implementations, the first deposition of material also results in a deposited layer 252 on the third resist layer 214. The deposited layer 252 can be deposited on a top surface (e.g., top surface region 252a) of the third resist layer 214 or the deposited layer 252 can be deposited on the top surface of the third resist layer 214 and on a side wall (e.g., side wall regions 252b) of the third resist layer 214.

In some implementations, during the first deposition step, material from the incident flux of the first deposition flow direction 251 is deposited on an exposed top surface 252c of the second resist layer 212, for example, as depicted in cross-sectional view 242 in FIG. 2B. In some implementations, the first flow deposition direction 251 is oriented with respect to opening 220 in the third resist layer 214 at angle 250, such that a portion of the flux of material from the first deposition is blocked by an edge of the opening 220. Deposition material 252b is deposited on a side wall region of opening 220 that is further away from the source of deposition of the first flow deposition direction, for example, as depicted in cross-sectional view 244 of FIG. 2B. The deposition 252b on a side wall region of opening 220 is partially blocked from depositing along the entire third thickness 215 of the third resist layer 214.

In some implementations, the first layer deposition deposits a bottom contact 248 with a first deposited layer thickness ($t_{dep}$) 254 on the substrate 208, and a second deposited layer thickness ($t_{metal}$) 256 on a side wall region 252b of the third resist layer 214. The second deposited layer thickness 256 can be related to the first deposited layer thickness 254 as follows:

$$t_{metal} = t_{dep}(1 - \cos\theta) \qquad (1)$$

where θ is angle 250. Angle 250 can be, for example, between 10-80° degrees.

After the first deposition step, the deposited layer 248 may be oxidized. For example, substrate 208 may be transferred to air or to a separate chamber where surface oxidation of the material constituting the deposited layer 248 occurs. In some implementations, the substrate may be left in the deposition chamber for in-situ oxidation.

After the first deposition step and prior to a second deposition step, the orientation between the substrate and the source of deposition material is altered. In some implementations, the substrate 208 is rotated with respect to the source of material. The source can be rotated with respect to the substrate 208 or the substrate 208 and source are rotated with respect to one another, depending in part on a configuration of the deposition system.

After oxidation, the substrate then may be subjected to a second deposition step, in which a second material (e.g., a superconducting material) is deposited to form a second deposited structure (e.g., a top contact 258 for a Josephson junction). FIG. 2C shows a schematic of the three-layer resist mask 200 in plan-view 260, cross-sectional view 262 through axis A-A, and cross-sectional view 264 through axis B-B after a second deposition of material to form a Josephson junction. The second deposition flow direction 271 contains a component along a y-axis parallel to a surface of the substrate 208. The second deposition flow direction 271 is oriented at an angle 270 with respect to the z-axis that is normal to the surface of the substrate 208. Angle 270 can be, for example, between 10-80° degrees with respect to the z-axis. The angle 270 during the second deposition may be different from the angle 250 during the first deposition. For example, in some implementations, the substrate surface may be oriented at a first angle 250 with respect to the first deposition flow direction 251 of the deposition material during the first deposition step (e.g., where first deposition flow direction 251 includes a component along the x-axis) and at a second angle 270 with respect to the second deposition flow direction 271 that is orthogonal to the first angle 250 during the second deposition step (e.g., where second deposition flow direction 271 includes a component along the y-axis).

The second layer deposition from second deposition flow direction 271 forms a second deposited structure (e.g., a top contact 258 for a Josephson junction) on the substrate 208 and within the opened regions of the three-layer resist mask 200, for example, as depicted in cross-sectional view 264 in FIG. 2C. In some implementations, the second deposited structure can be deposited on top of the first deposited structure (e.g., the bottom contact 248), for example, to form a Josephson junction.

In some implementations, a portion of the first deposited layer, a portion of the oxidized region on top of the first deposited layer, and a portion of the second deposited layer on top of the oxidized region form a part of a quantum computational system (e.g., a qubit). In some implementations, a portion of the first deposited layer, a portion of the oxidized region on top of the first deposited layer, and a portion of the second deposited layer on top of the oxidized region form a part of a Josephson junction.

In some implementations, the second deposition of material also results in a deposited layer 272 on previously deposited layer 252. The deposited layer 272 can be deposited on a top surface (e.g., top surface region 252a) of the previously deposited layer 252 or the deposited layer 272 can be deposited on the top surface of the previously deposited layer 252 and on a side wall region 252b, 252c of previously deposited layer 252.

In some implementations, material is deposited on an exposed top surface 272c of the second resist layer 212 along a same direction of the second flow deposition direction 271, for example, as depicted in cross-sectional view 264 in FIG. 2C.

In some implementations, material deposited on a side wall region 272b at an angle 270 with respect to the second flow deposition direction 271 such that a portion of the third resist layer 214 and/or the previously deposited layer 252 blocks the deposition of at least some of the depositing material within the opening 220. For example, cross-sectional view 262 of FIG. 1C depicts a second deposition flow direction 271 oriented at an angle 270 with respect to the substrate 208 such that a deposition on a side wall region 272b is partially blocked from depositing along the entire third thickness 215 of the third resist layer 214.

In some implementations, the second layer deposition deposits a top contact 258 with a first deposited layer thickness ($t_{dep}$) 274 on the substrate 208, and a second deposited layer thickness ($t_{metal}$) 276 on a side wall region 272b of the third resist layer 214. The second deposited layer thickness 256 can be related to the first deposited layer thickness 254 as follows.

$$t_{metal} = t_{dep}(1 - \cos \theta) \quad (1)$$

where θ is, for example, angle 270. Angle 270 can be, for example, between 10-80° degrees.

In some implementations, a first deposited thickness ($t_{dep}$) 256 on side wall region 252b of the third resist layer is less than a second undercut width 230 and material is not deposited (or negligibly deposited) on the exposed top surface of the second resist layer 212 with second undercut width 230. Under such circumstances, the second deposition of material (e.g., top contact 258) is not affected by shadowing effects, for example, a width of the top contact 258 is an intended width 224 defined by opening 218 of the three-layer resist mask 200 rather than a width smaller than the width 224 of the opening 218.

In some implementations, a first undercut width 228 and second undercut width 230 are not equal in value. Additionally, a first undercut width 228 defined by a first deposition flow direction 251 can have a different value than a first undercut width 228 defined by a second deposition flow direction 271, as discussed in further detail with reference to FIG. 4A below.

In some implementations, one or more parameters of the three-layer resist mask 200 and/or one or more parameters of the two-step deposition process can be adjusted to reduce shadowing effects, for example, where one or more dimensions of a second deposited structure can be different than intended dimensions due to shadowing from deposited material during the first deposition step. FIGS. 3A-D are diagrams of cross-sectional views of a two-step deposition process for various exemplary three-layer resist masks. The cross-sectional views shown in FIGS. 3A-D are similar to the cross-sectional view 264 through axis B-B shown in FIG. 2C. The three-layer resist masks on substrate 308 include first resist layer 310, second resist layer 312, and third resist layer 314 with respective openings 316, 318, and 320, similar to the openings discussed with reference to FIGS. 2A-C.

Though a deposition from a second deposition step is not shown on a top surface of the cross-sectional views depicted in FIGS. 3A-D for simplicity, an amount of material from a second deposition can be imagined to be deposited on at least a portion of the top surfaces of each of the cross-sectional views similar to the second deposition layer 272 shown in FIG. 2C.

In general, various parameters of the three-layer resist mask 200 and the two-step deposition process can be related as follows:

$$\tan \theta < \frac{t_3}{(w + uc1 + t_{metal})} \quad (2)$$

$$t_{metal} < uc2 \quad (3)$$

where $t_{metal}$ is a thickness of metal deposited on a side wall of a resist layer (e.g., thickness 356), θ is an angle of deposition with respect to the substrate for a first deposition step (e.g., angle 350), $t_3$ is a thickness of the third resist layer (e.g., third thickness 315), w is a width of a second opening of a second resist layer (e.g., width 324), uc1 is a first undercut width (e.g., undercut width 328), and uc2 is a second undercut width (e.g., undercut width 330).

As discussed above with reference to equation (1), thickness of metal deposited on a side wall 356 of a top resist layer (e.g., third resist layer 314) can be related to the thickness of deposition by angle θ (e.g., angle 350). As the angle increases closer to 90 degrees with respect to the z-axis perpendicular to the substrate surface), the thickness of metal deposited on a side wall $t_{metal}$ approaches the thickness of the metal deposition $t_{dep}$.

Figure 6:
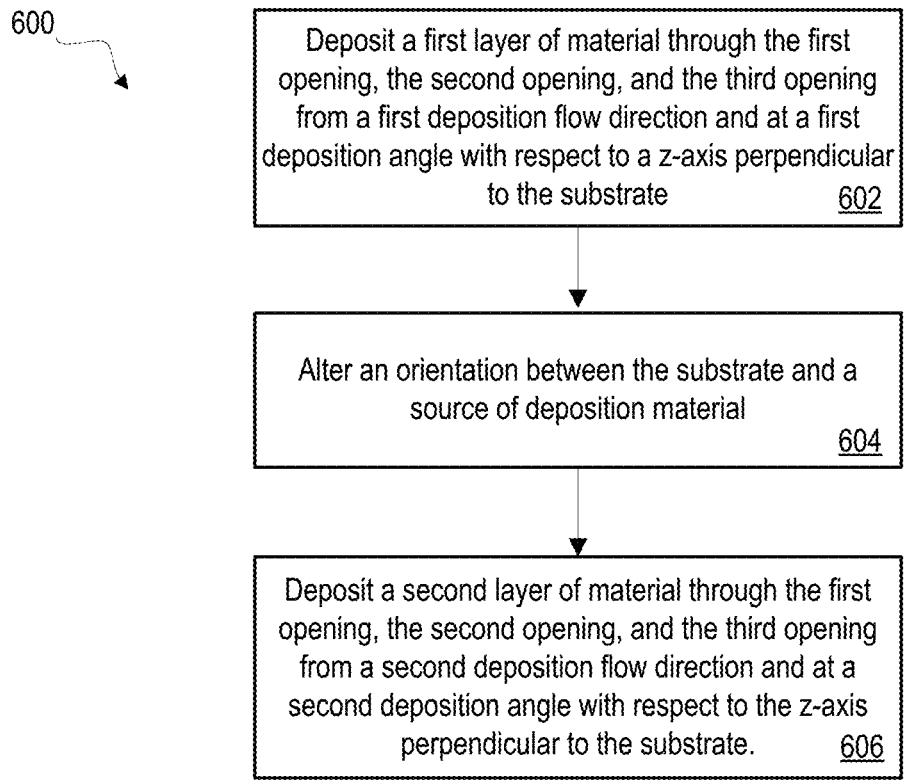
FIG. 6 is a flow diagram of an exemplary process for forming a Josephson junction using a multi-layer resist mask.

FIGS. 3A-D show both a first deposition of material and a second deposition of material and indicate a first flow of deposition 351 and a second flow of deposition 371 in a same illustration, however, it is to be understood that the first deposition step precedes a second deposition step as described with reference to FIGS. 2B and 2C and FIG. 6.

FIG. 3A is a diagram of a cross-sectional view of a three-layer resist mask similar to three-layer resist mask 200 depicted in FIGS. 2A-C, where a first undercut width 328 and a second undercut width 330 are non-zero and the first deposition angle 350 is comparable to related values discussed with reference to FIGS. 2B-2C.

FIG. 3B is a diagram of a cross-sectional view of a two-step deposition process for another example three-layer resist mask, where a first undercut width 328 exceeds a threshold width, such that a first deposition of material covers a side wall of a third resist layer 314 as well as at least a portion of a side wall of a second resist layer 312. A threshold width for the first undercut width (uc1) 328 can be defined as:

$$\text{threshold width} = \frac{t_3}{\tan \theta} - (w + t_{metal}) \quad (4)$$

In the case where side wall deposition occurs on a second resist layer 312 as result of exceeding a threshold width value, shadowing effects on the second deposited layer 358 can be observed due to a narrowing of an opening in the second resist layer with respect to an intended width of the second opening of the second resist layer. For example, at least a portion of the deposited second layer 358 can have a width 380 that is less than an intended width defined by a width 324 of a second opening 318 of the second resist layer 312.

FIG. 3C is a diagram of a cross-sectional view of a two-step deposition process for a three-layer resist mask, where an amount of first deposition material deposited on a side wall 356 of a third resist layer 314 exceeds a second undercut width 330. In the case where a width of the first deposition material deposited on a side wall 356 of a third resist layer 314 exceeds a width of a second undercut width 330, shadowing effects on the second deposited layer can be observed due to a narrowing of an opening in the second resist layer with respect to an intended width of the second opening of the second resist layer 312. For example, at least a portion of the deposited second layer 358 can have a width 380 that is less than an intended width defined by a width 324 of a second opening 318 of the second resist layer 312.

FIG. 3D is a diagram of a cross-sectional view of a two-step deposition process for a three-layer resist mask, where a second undercut width is approximately zero or zero, such that any deposition on a sidewall of the third resist layer 314 can cause shadowing effects during a second deposition of material. For second undercut width that is approximately zero, the width is a non-zero distance sufficiently small to have the same shadowing effects during a second deposition of material as a second undercut width that is equal to zero. The shadowing effects can include blocking at least a portion of the second opening from view by a source (not shown) during a second deposition step such that an opening through which deposition on the substrate 308 takes place is narrower in one or more directions with respect to an intended width defined by the second opening 318 of the second resist layer 312. For example, at least a portion of the deposited second layer 358 can have a width 380 that is less than an intended width defined by a width 324 of a second opening 318 of the second resist layer 312.

In some implementations, other parameters can generate shadowing effects during a second deposition process. For example, a thickness of a third resist layer that is selected smaller than a threshold thickness with respect to an angle of deposition can result in side wall deposition on a second resist layer (as well as on a third resist layer) and cause shadowing effects during a second deposition step. In another example, roughening in a first deposited layer (e.g., a deposited aluminum), resulting in part due to grain growth and/or grain morphology (e.g., grain boundaries) of the deposited material of the first deposited layer, can cause uneven shadowing effects (e.g., sidewall deposition from the first deposited layer is uneven). Uneven deposition due to roughening of the first deposited layer can result in a second deposited layer that is shadowed unevenly along a length of the deposited structure (e.g., a Josephson junction).

After the shadow evaporation process, the resist may be removed in a lift-off step to remove unwanted material and complete the fabrication of the Josephson junctions. Lift-off may be performed using various different solvents and/or chemistries depending on the chemical composition of the resist material.

In some implementations, one or more of the shadowing effects (e.g., deposition from the first deposition step obstructing a portion of the opening of the resist mask) that arise with the above mentioned layout of the three-layer resist mask can be resolved by a careful selection of a first undercut width. In particular, a selection of a first undercut width that is zero or approximately zero can rectify one or more of the sensitivities to deposition parameters (e.g., angle of deposition, thickness of deposition) is discussed in further detail with reference to FIGS. 4A-4C.

Figure 4A:
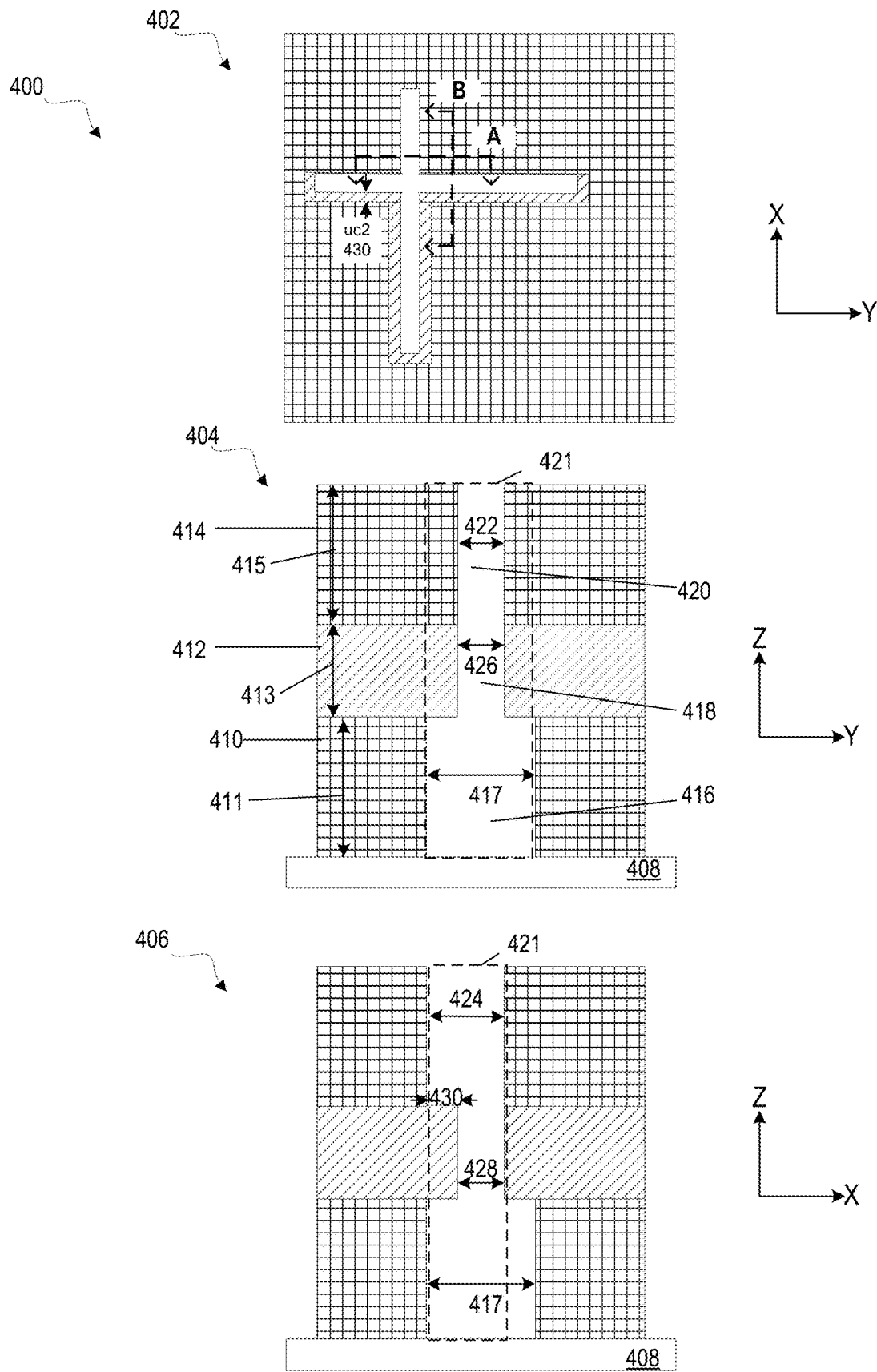
FIGS. 4A-C are diagrams of various views showing another exemplary two-step deposition process through a three-layer resist mask.
Figure 4B:
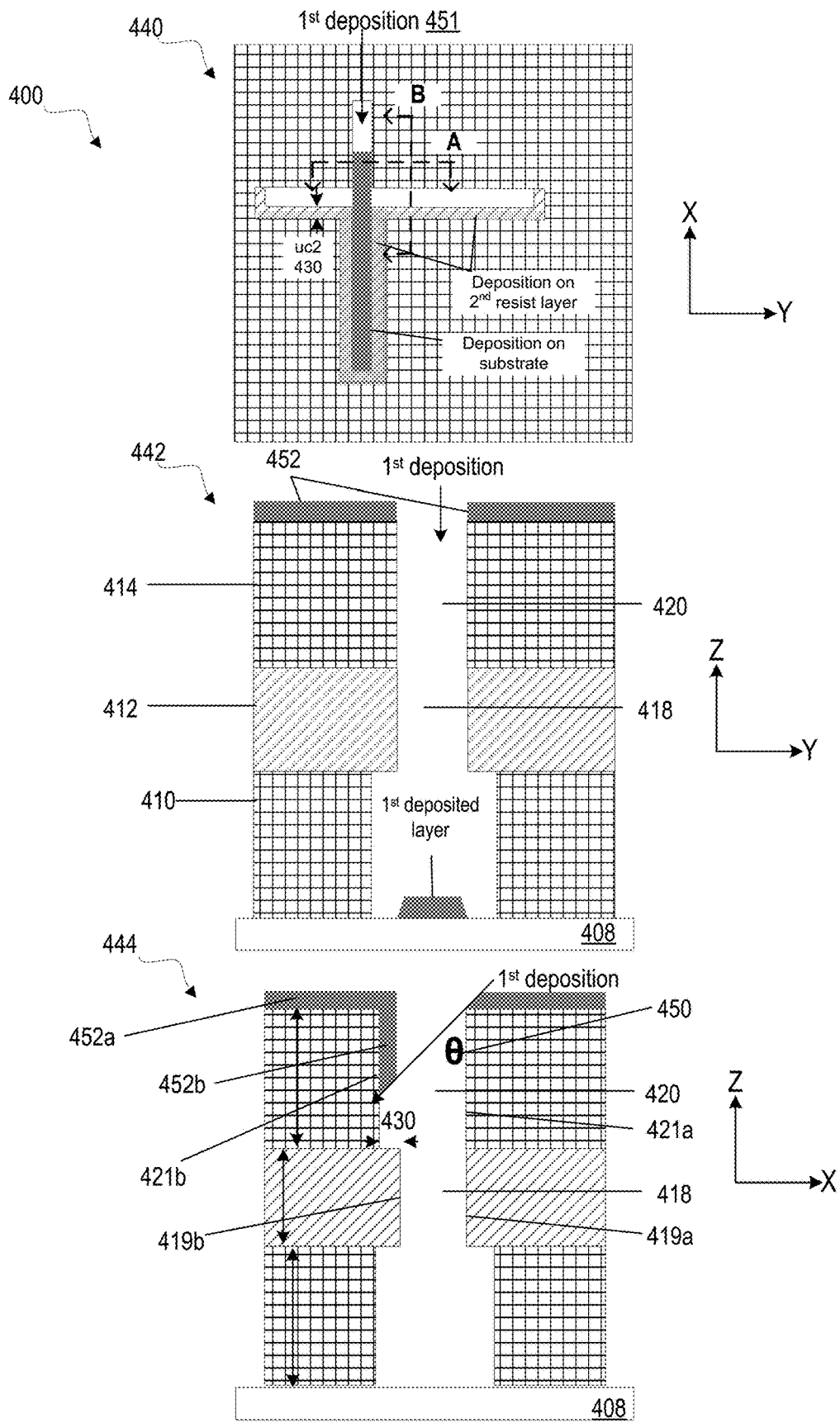
Figure 4C:
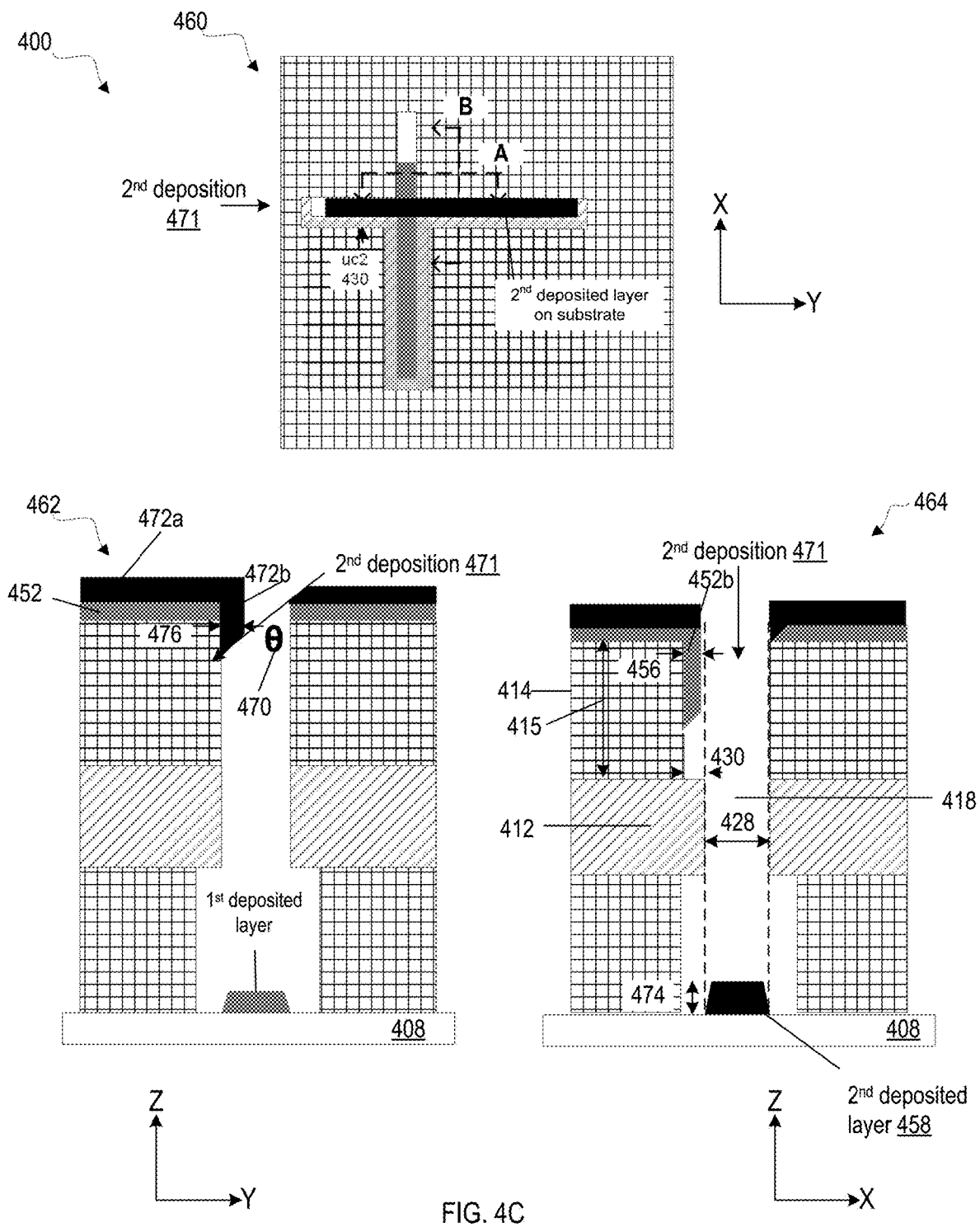

FIGS. 4A-C are diagrams of various views showing another exemplary two-step deposition process through a three-layer resist mask 400. FIG. 4A shows a schematic of a three-layer resist mask 400 is plan-view 402, a cross-sectional view 404 through axis A-A, and a cross-sectional view 406 through axis B-B. Three-layer resist mask 400 is configured such that the first undercut (uc1) width is equal to or nearly equal to zero.

The three-layer resist mask 400 includes a first resist layer 410, a second resist layer 412, and a third resist layer 414, with respective layer thicknesses 411, 413, and 415, and is configured similar to three-layer resist mask 200 described with reference to FIGS. 2A-C. However, three-layer resist mask 400 differs in the locations of the relative openings 416, 418, and 420 in the resist layers 410, 412, and 414, respectively. In particular, mask opening region 421, as shown in cross-sectional view 404 along the Y-direction and as shown in cross-sectional view 406 along the X-direction, is aligned such that a width of one or more of the undercut widths is zero and/or approximately zero. For example, as depicted in cross-sectional view 404, the width 422 along the Y-direction of opening 420 is equal or nearly equal to a width 426 along the Y-direction of opening 418 (e.g., a first undercut width and a second undercut width are equal to zero). In another example, as depicted in cross-sectional view 406, the width 424 along the X-direction of opening 420 is defined such that a first undercut width is zero or approximately zero and a second undercut width 430 has a non-zero value. That is, a sidewall of the resist layer 414 on one side of the opening 424 is flush with a sidewall of the opening 428.

In some implementations, the third resist layer 414 can have a smaller width (e.g., widths 422, 424) of the third opening 420 than a width 417 of the first opening 416 of the first resist layer by exposing the third resist layer to a pattern that is narrower than the pattern exposed on the first resist layer 410, and can additionally be off-set (e.g., as depicted in cross-sectional view 406, where opening 424 is not directly aligned with the first opening 417 but still within the bounds of the first opening 417).

An advantage of a zero or approximately zero first undercut width is discussed with reference to FIG. 4B. FIG. 4B shows a schematic of a three-layer resist mask 400 in plan-view 440, a cross-sectional view 442 through axis A-A and a cross-sectional view 444 through axis B-B after a first deposition of material to form a Josephson junction. A relative orientation of the substrate with respect to a source of deposition material is the same as that discussed above with reference to FIGS. 1A-C and FIGS. 2A-C.

As discussed with reference to FIGS. 2A-C, the first undercut width is defined by a difference in a distance between the respective edges of a second opening 418 and a third opening 420 (e.g., edges 419a and 421a, respectively in cross-sectional view 444) that are closer to a material deposition source and the second undercut width is defined by a difference in a distance between the respective edges of a second opening 418 and a third opening 420 (e.g., 419b and 421b, respectively in cross-sectional view 444) that are further away from a material deposition source. In the example of three-layer resist mask 400 depicted in cross-sectional view 444 of FIG. 4B, a first undercut width is zero or approximately zero and a second undercut width 430 is a non-zero value.

The first layer deposition from a first deposition flow direction 451 forms a first deposited structure (e.g., a bottom contact 448 for a Josephson junction) elongated along the x-axis in the plane of the substrate 408 and within the opened regions of the three-layer resist mask 400, for example, as depicted in the plan view 440 and in the cross-sectional view 442 in FIG. 4B. In some implementations, the first deposition of materials also results in a deposited layer 452 on the third resist layer 414. The deposited layer 452 can be deposited on a top surface (e.g., top surface region 452a) of the third resist layer 414 and/or a side wall (e.g., side wall regions 452b) of the third resist layer 414.

As shown in the cross-section view 444, decreasing the undercut width of a first side of opening 420 (i.e., the edge 421a of opening 420 closest to the material deposition source) for a particular angle θ of deposition reduces the extent of material deposited on the opposite second side wall 452b of layer 414 within the opening region 420. That is, as the undercut width decreases, the material from flux 451 is increasingly blocked by the upper corner of layer 414. In turn, less material reaches the sidewall 452b opposite to that of the corner of layer 414 associated with blocking flux 451. As a result, the material deposited on sidewall 452b terminates further away from the layer 412. The maximum distance between an upper surface of layer 412 and a terminating portion of material deposited on sidewall 452b may be achieved, for a particular incident angle θ of flux 451, by reducing the undercut width of the first side of opening 420. In some implementations, a first undercut width 228 is approximately zero (e.g., non-zero width that is sufficiently small) such that a maximum distance between an upper surface of layer 412 and a terminating portion of material deposited on sidewall 452b may be achieved, for a particular incident angle θ of flux 451, as does an undercut width that is equal to zero.

After the first layer deposition step, the first deposited layer may be oxidized (e.g., by transferring substrate 208 to air, to a separate chamber, or left in the deposition chamber for in-situ oxidation, where surface oxidation of the deposited material is promoted), as discussed above in more detail with reference to FIGS. 2A-C.

FIG. 4C shows a schematic of the three-layer resist mask 400 in plan-view 460, cross-sectional view 462 through axis A-A, and cross-sectional view 464 through axis B-B after a second deposition of material to form a Josephson junction. Again, the substrate surface facing a material deposition source (not shown) can be oriented at an angle 470 with respect to a flux direction 471 of the second deposition material, the details of which are discussed in more detail with reference to FIG. 2C.

The second layer deposition from a second deposition flow direction 471 forms a second deposited structure (e.g., a top contact 458 for a Josephson junction) on the substrate 408 and within the opened regions of the three-layer resist mask 400, for example, as depicted in planview 460 and in cross-sectional view 464 in FIG. 4C. In some implementations, the second deposition of material also results in a deposited layer 472 on the previously deposited layer 452 from a first layer deposition, similar to deposited layer 272 discussed above with reference to FIG. 2C.

In some implementations, the second layer deposition deposits a top contact 458 with a first deposited layer thickness ($t_{dep}$) 474 on the substrate 408, and a second deposited layer on a side wall region 472b with thickness ($t_{metal}$) 476, where the relationship between $t_{dep}$ and $t_{metal}$ is the same as the relationship described in equation 1 with reference to FIG. 2C and flux incident angle 470.

In some implementations, a first deposited thickness ($t_{dep}$) 456 on side wall region 452b of the third resist layer is less than a second undercut width 430 and material is not deposited (or negligibly deposited) on the exposed top surface of the second resist layer 412 with second undercut width 430. Under such circumstances, the second deposition of material (e.g., top contact 458) is not affected by shadowing effects, for example, a width of the top contact 458 is an intended width 428 defined by opening 418 of the three-layer resist mask 400 rather than a width smaller than the width 428 of the opening 418.

Figure 5:
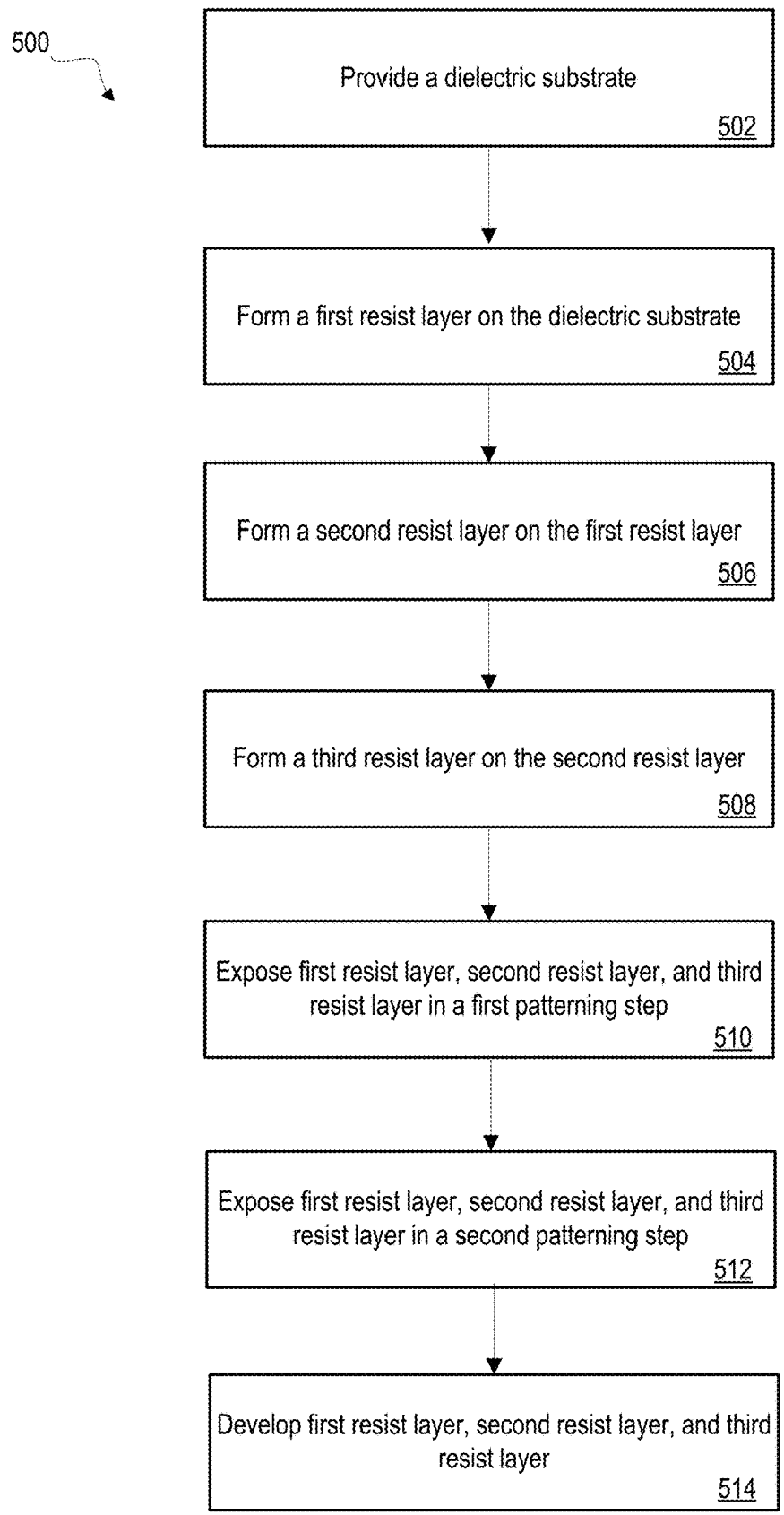
FIG. 5 is a flow diagram of an exemplary process for forming a multi-layer resist mask.

FIG. 5 is a flow diagram of an exemplary process 500 for forming a multi-layer resist mask, for example, the two-layer and three-layer resist masks described with reference to FIGS. 1A-C, 2A-C, and 4A-C. A dielectric substrate is provided (e.g., substrate 208) (502). A dielectric substrate can include silicon, sapphire, diamond or another substrate material with similar dielectric properties.

A first resist layer is formed on the dielectric substrate (e.g., substrate 208) (504) including a first thickness (e.g., first resist layer 210 having thickness 211). The first resist layer can be formed on a surface of the dielectric substrate, for example, as described above with reference to FIG. 2A. The first resist layer can be composed of an e-beam lithography compatible material (e.g., P(MMA-MAA), PMMA, ZEP520, UV5/UVIIII), a DUV lithography compatible material (e.g., UV6, UV210), a lift-off material (e.g., LOL, LOR, PMGI), or another resist material that is compatible with both e-beam lithography and DUV lithography (e.g., PMMA, P(MMA-MAA)). The first resist layer can be formed on the dielectric substrate using a deposition technique including spin coating.

A second resist layer is formed on the first resist layer (e.g., first resist layer 210) including a second thickness (e.g., a second resist layer 212 having thickness 213) (506). The second resist layer and second opening can be formed on a surface of the first resist layer, for example, as described above with reference to FIG. 2A. The second resist layer can be composed of an e-beam lithography compatible material (e.g., P(MMA-MAA), PMMA, ZEP520, UV5/UVIIII), a DUV lithography compatible material (e.g., UV6, UV210), a lift-off material (e.g., LOL, LOR, PMGI), or another resist material that is compatible with both e-beam lithography and DUV lithography (e.g., PMMA, P(MMA-MAA)) and that is a different material than the resist material of the first resist layer. The second resist layer can be formed on first resist layer using a deposition technique including spin coating.

A third resist layer is formed on the second resist layer (e.g., second resist layer 212) including a third thickness (e.g., third resist layer 214 having thickness 215) (508). The third resist layer can be formed on a surface of the second resist layer, for example, as described above with reference to FIG. 2A. The third resist layer can be composed of an e-beam lithography compatible material (e.g., P(MMA-MAA), PMMA, ZEP520, UV5/UVIIII), a DUV lithography compatible material (e.g., UV6, UV210), a lift-off material (e.g., LOL, LOR, PMGI), or another resist material that is compatible with both e-beam lithography and DUV lithography (e.g., PMMA, P(MMA-MAA)) and that is a different material than the resist material of the second resist layer. The third resist layer can be formed on the second resist layer using a deposition technique including spin coating.

The first resist layer, the second resist layer, and the third resist layer are exposed in a first patterning step (510), for example, as described with reference to FIG. 2A. The first patterning step can include a first exposure dose that is sufficient to define features corresponding to a pattern into the first resist layer, the second resist layer, and the third resist layer. One or more openings in the multi-layer resist mask can be defined by the first patterning step. For example, an opening in a second resist layer (e.g., opening 218 having a width 224 in second resist layer 212) is defined. The first resist layer and third resist layer can also be exposed during the first pattern, and then further exposed during a second patterning step.

The first resist layer, the second resist layer, and the third resist layer are exposed in the second patterning step (512), for example, as described with reference to FIG. 2A. The second patterning step can include a second exposure dose that is sufficient to define features corresponding to a pattern into the first resist layer and the third resist layer, but not sufficient to define features corresponding to a pattern into the second resist layer. As result, the one or more openings in the first resist layer and third resist layer (e.g., opening 216 in first resist layer 210 and opening 220 in third resist layer 214) are defined during the second patterning step.

The first and second patterning steps define respective openings in the first resist layer, the second resist layer, and the third resist layer such that the first resist layer includes a first opening extending through a thickness of the first resist layer, the second resist layer includes a second opening aligned over the first opening and extending through a thickness of the second resist layer, and the third resist layer includes a third opening aligned over the second opening and extending through a thickness of the third resist layer.

The first resist layer, the second resist layer, and the third resist layer are developed in one or more development processes (514). A development process can include one or more developers to remove either exposed or non-exposed resist material, depending in part on whether positive resist material or negative resist material is used. Developers can include MIBK:IPA (e.g., in a ratio 1:3, 1:2, 1:1), MIBK and AZ300MIF, depending in part on the different resist materials used in the multi-layer resist mask. A range of development time for AZ300MIF includes 40-90 seconds. In one example, a development time using AZ300MIF is 70 seconds for sub-micron to micron range openings.

Though the multi-layer resist masks described herein include two-layer resist masks and three-layer resist masks, more than three resist layers can be used.

The multi-layer resist mask can then be used to form at least a portion of a quantum computation system (e.g., a Josephson junction including a bottom contact and a top contact), as described with reference to FIGS. 1A-C, 2A-C and 4A-C. FIG. 6 is a flow diagram of an exemplary process 600 for forming at least a portion of a quantum computational system (e.g., a Josephson junction) using a multi-layer resist mask. The multi-layer resist mask includes three resist layers, each resist layer having an opening in the resist layer extending from a top surface of the resist layer through a thickness of the resist layer. Each respective opening of the resist layers is aligned on top of one another such an opening region is created that extends from a top surface of a top resist layer of the three resist layers through the respective thicknesses of the three resist layers to a principal surface of the substrate. A first layer of material is deposited through the first opening, the second opening, and the third opening (e.g., openings 216, 218, 220 respectively) from a first deposition flow direction (e.g., flow direction 251) at a first deposition angle (e.g., angle 250) with respect to a z-axis perpendicular to a principal surface of the substrate (e.g., substrate 208), and including a component along an x-axis with respect to the principal surface of the substrate (602).

An orientation between the substrate and a source of deposition material is altered (604). In some implementations, the orientation of the source of deposition material is altered with respect to the substrate or respective orientations of the source of deposition material and substrate are altered with respect to one another. For example, the substrate is rotated 90 degrees with respect to the source of deposition material such that a direction of material flux for a first deposition (e.g., first deposition flow direction 251) and a direction of material flux for a second deposition (e.g., second deposition flow direction 271) are orthogonal to each other. In another example, the substrate is tilted with respect to a direction of material flux, such that an angle between a plane defined parallel to a surface of the substrate and the direction of material flux for a first deposition (e.g., first deposition flow direction 251) and an angle between the plane defined parallel to the surface of the substrate and the direction of material flux for a second deposition (e.g., second deposition flow direction 271) are orthogonal to each other.

In some implementations, the substrate is transferred to air, to a separate chamber, or left in the deposition chamber for in-situ oxidation, where surface oxidation of the deposited material is promoted, as described with reference to FIG. 1B, prior to a second deposition step.

A second layer of material is deposited through the first opening, the second opening, and the third opening from a second deposition flow direction (e.g., second deposition flow direction 271) and at a second deposition angle (e.g., angle 270) with respect to the z-axis perpendicular to the substrate (606).

In some implementations, after the second layer of material is deposited, the multi-layer resist mask and any unwanted deposited material is removed in a lift-off step to remove unwanted material and complete Josephson junction fabrication.

In some implementations, some or all of the processes and characterization techniques mentioned above take place in a controlled environment which may include a high-purity vacuum chamber, temperatures below the superconducting temperature of the superconducting material, or a combination there of.

An example of a superconducting material that can be used in the formation of quantum circuit elements is aluminum. Aluminum may be used in combination with a dielectric to establish Josephson junctions, which are a common component of quantum circuit elements. Examples of quantum circuit elements that may be formed with aluminum include circuit elements such as superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

Aluminum may also be used in the formation of superconducting classical circuit elements that are interoperable with superconducting quantum circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum information processing devices, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum information processing devices may be used to perform quantum processing operations. That is, the quantum information processing devices may be configured to make use of quantum-mechanical phenomena, such as superposition and entanglement, to perform operations on data in a non-deterministic manner. Certain quantum information processing devices, such as qubits, may be configured to represent and operate on information in more than one state simultaneously. Examples of superconducting quantum information processing devices that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum information processing devices and/or superconducting classical circuit elements, such as the circuit elements described herein, the superconducting circuit elements are cooled down within a cryostat to temperatures that allow a superconducting material to exhibit superconducting properties. A superconductor (alternatively superconducting) material can be understood as material that exhibits superconducting properties at or below a superconducting critical temperature. Examples of superconducting material include aluminum (superconductive critical temperature of about 1.2 kelvin), indium (superconducting critical temperature of about 3.4 kelvin), NbTi (superconducting critical temperature of about 10 kelvin) and niobium (superconducting critical temperature of about 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

A number of implementations have been described. Nevertheless, it will be understood that various modifications may be made without departing from the spirit and scope of the invention. Other implementations are within the scope of the following claims.

The invention claimed is:

1. A method comprising:
providing a dielectric substrate and a multi-layer resist structure on a surface of the dielectric substrate,
wherein the multi-layer resist structure comprises a first photoresist layer including a first opening extending through a thickness of the first photoresist layer, a second photoresist layer including a second opening aligned over the first opening and extending through a thickness of the second photoresist layer, and a third photoresist layer including a third opening aligned over the second opening and extending through a thickness of the third photoresist layer,
wherein at least two photoresist layers of the multi-layer resist structure are in direct contact with one another,
wherein the thickness of each of the first opening, the second opening and the third opening extend along a first direction normal to the surface of the dielectric substrate,
each of the first opening, the second opening, and the third opening has a corresponding width that extends along a second direction that is orthogonal to the first direction, and
a width of the second opening is less than a width of the first opening and less than a width of the third opening.

2. The method of claim 1, comprising:
depositing a first layer of material through the first opening, the second opening, and the third opening at a first deposition angle with respect to the surface of the dielectric substrate; and
depositing a second layer of material through the first opening, the second opening, and the third opening at a second deposition angle with respect to the surface of the dielectric substrate,
wherein an orientation between the surface of the dielectric substrate and a material deposition source is altered from a first position for the first layer deposition to a second position for the second layer deposition.

3. The method of claim 2, wherein the first deposition angle and the second deposition angle are different.

4. The method of claim 3, wherein the first deposition angle is orthogonal to the second deposition angle.

5. The method of claim 2, wherein the first deposition angle is an oblique angle with respect to the surface of the dielectric substrate, and
wherein one or more of the first opening, second opening, and/or third opening of the multi-layer resist structure blocks at least some of the deposition material from the first deposition.

6. The method of claim 5, wherein the second deposition angle is such that a portion of the second photoresist layer and/or the previously deposited first layer of material near an edge of the first opening, second opening, and/or third opening blocks at least some of the deposition material from the second deposition within the first opening, second opening, and/or third opening.

7. The method of claim 2, wherein the first position for the first layer deposition and the second position for the second layer deposition are orthogonal with respect to one another.

8. The method of claim 2, wherein the first layer of material and the second layer of material are a superconducting material.

9. The method of claim 2, further comprising performing a surface oxidation of the first layer of material to provide an oxidized region of the first layer of material prior to depositing the second layer of material.

10. The method of claim 9, wherein a portion of the first layer of material, a portion of the oxidized region, and a portion of the second layer of material form part of a quantum information processing device.

11. The method of claim 2, further comprising removing the first photoresist layer, the second photoresist layer, the third photoresist layer.

12. The method of claim 2, comprising rotating the substrate after depositing the first layer of material and prior to depositing the second layer of material.

13. The method of claim 2, comprising changing a position of the material deposition source with respect to the dielectric substrate after depositing the first layer of material and prior to depositing the second layer of material.

14. The method of claim 2, wherein the third opening comprises a first undercut width defined between a first side of the third opening and a first side of the second photoresist layer, and comprises a second undercut width defined between a second side of the third opening and a second side of the second photoresist layer, wherein the first undercut width is greater than the second undercut width.

15. The method of claim 14, wherein the second undercut width is zero.

16. The method of claim 14, wherein each of the first opening, the second opening, and the third opening has a corresponding additional width that extends along a third direction that is orthogonal to the first direction and to the second direction,
wherein the additional width of the of the third opening is the same as the additional width of the second opening.

17. The method of claim 2, wherein the first layer corresponds to a first portion of a Josephson junction, and wherein the second layer corresponds to a second portion of the Josephson junction.

18. The method of claim 17, wherein the Josephson junction forms part of a qubit.

19. A method comprising:
providing a dielectric substrate and a multi-layer resist structure on a surface of the dielectric substrate,
wherein the multi-layer resist structure comprises a first resist layer including a first opening extending through a thickness of the first resist layer, a second resist layer including a second opening aligned over the first opening and extending through a thickness of the second resist layer, and a third resist layer including a third opening aligned over the second opening and extending through a thickness of the third resist layer,
wherein the thickness of each of the first opening, the second opening and the third opening extend along a first direction normal to the surface of the dielectric substrate,
each of the first opening, the second opening, and the third opening has a corresponding width that extends along a second direction that is orthogonal to the first direction, and
a width of the second opening is less than a width of the first opening and less than a width of the third opening;
depositing a first layer of material through the first opening, the second opening, and the third opening at a first deposition angle with respect to the surface of the dielectric substrate; and
depositing a second layer of material through the first opening, the second opening, and the third opening at a second deposition angle with respect to the surface of the dielectric substrate,
wherein a relative orientation between the surface of the dielectric substrate and a material deposition source is altered from a first position for the first layer deposition to a second position for the second layer deposition.

20. The method of claim 19, wherein the relative orientation of the surface of the dielectric to the material deposition source in the second position is rotated 90 degrees from the first position.

21. The method of claim 19, further comprising performing a surface oxidation of the first layer of material to provide an oxidized region of the first layer of material prior to depositing the second layer of material,
wherein a portion of the first layer of material, a portion of the oxidized region, and a portion of the second layer of material form part of a quantum information processing device.

* * * * *